(12) United States Patent
Suzuki et al.

(10) Patent No.: US 6,815,746 B2
(45) Date of Patent: Nov. 9, 2004

(54) SEMICONDUCTOR DEVICE AND METHOD OF MANUFACTURING THE SAME

(75) Inventors: Makoto Suzuki, Higashimurayama (JP); Takafumi Kikuchi, Higashiyamato (JP); Norihiko Sugita, Ann Arbor (US); Seiichi Shirakawa, Igawa (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/268,699

(22) Filed: Oct. 11, 2002

(65) Prior Publication Data

US 2003/0075797 A1 Apr. 24, 2003

(30) Foreign Application Priority Data

Oct. 18, 2001 (JP) ........................................ 2001-320073

(51) Int. Cl.[7] .............................................. H01L 27/108
(52) U.S. Cl. ....................... 257/296; 257/676; 257/686; 257/693; 257/731; 257/736; 257/774; 257/778; 257/781
(58) Field of Search ................................. 257/676, 686, 257/693, 731, 736, 774, 778, 781

(56) References Cited

U.S. PATENT DOCUMENTS 6,200,121 B1   3/2001   Tsuruta 6,335,565 B1 * 1/2002 Miyamoto et al. .......... 257/686

FOREIGN PATENT DOCUMENTS

JP          2000-12578          1/2000

* cited by examiner

Primary Examiner—David Nelms
Assistant Examiner—Mai-Huong Tran
(74) Attorney, Agent, or Firm—Mattingly, Stanger & Malur, P.C.

(57) ABSTRACT

The present invention provides a small-sized and inexpensive semiconductor device wherein a synchronous dynamic random access memory and a flash memory are built in a single encapsulater. A flash memory chip and a synchronous dynamic random access memory chip (SDRAM chip) are fixed to a main surface of a wiring board in a parallel state, and another SDRAM chip is fixed onto the flash memory chip. Electrodes for the respective semiconductor chips are respectively exposed and these electrodes are connected to their corresponding electrodes of the wiring board. An encapsulater formed of an insulating resin is formed on the main surface side of the wiring board so as to cover wires. Since the encapsulater is formed by cutting a block encapsulater formed by block molding by dicing, the side faces of the encapsulater result in cut surfaces. Bump electrodes are provided on the back surface of the wiring board in an array fashion.

1 Claim, 30 Drawing Sheets

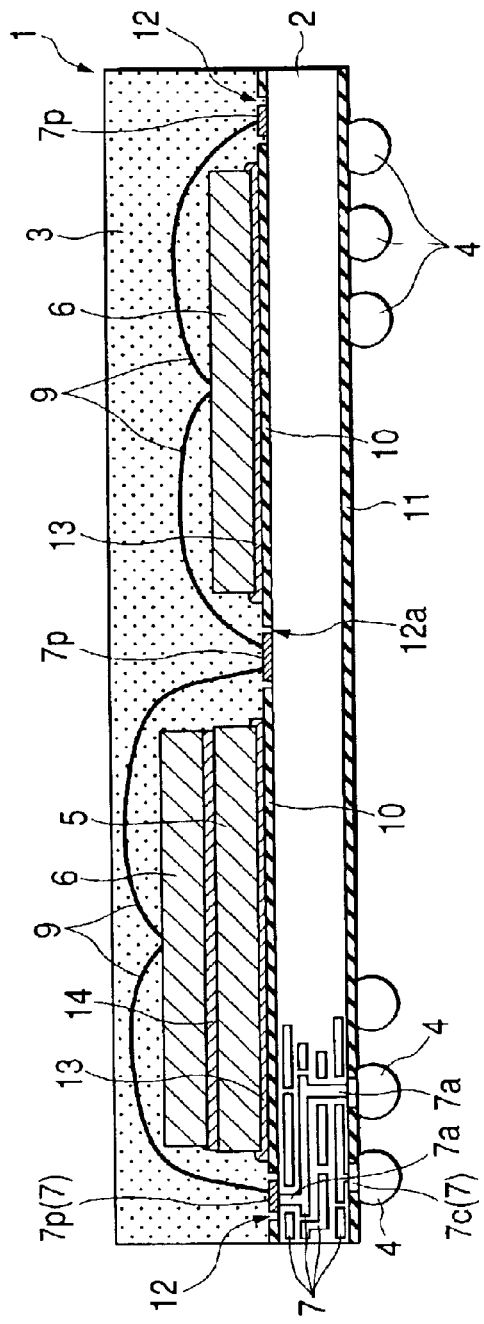
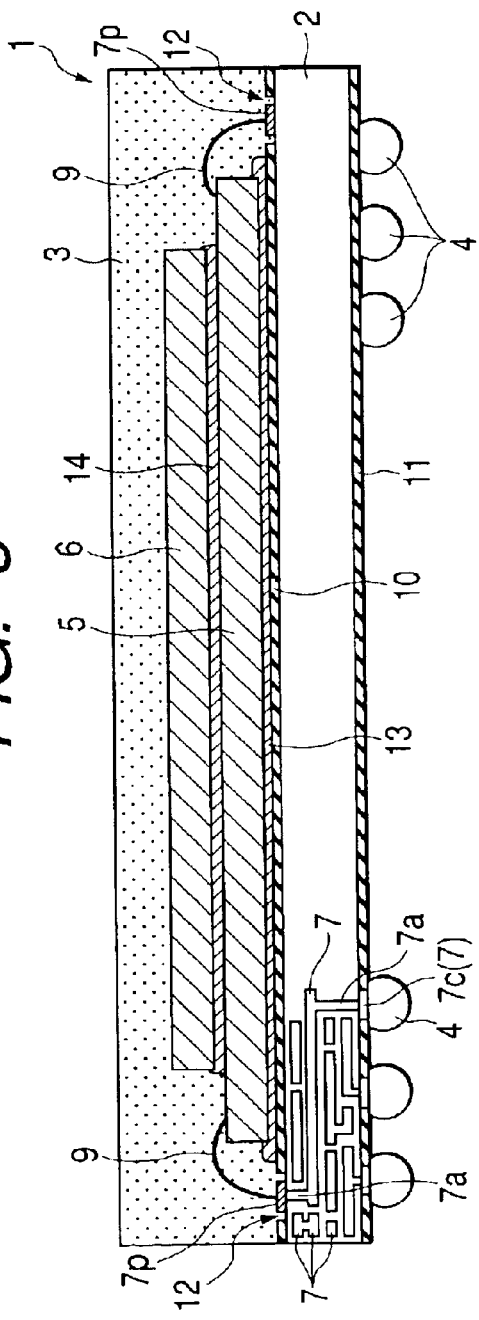

FIG. 8

| | 15 | 14 | 13 | 12 | 11 | 10 | 9 | 8 | 7 | 6 | 5 | 4 | 3 | 2 | 1 | |
|---|---|---|---|---|---|---|---|---|---|---|---|---|---|---|---|---|
| R | N.C | N.C | SDA13 | | Vcc-SD | FA15 | FA17 | Vcc-SD | VccQ | FA19 | FA20 | Vcc-SD | VccQ | Vss-F | N.C | N.C | R |
| P | N.C | SDA11 | SDA12 | Vss-SD | FA14 | FA16 | Vss-SD | VssQ | FA18 | N.C | Vss-SD | VssQ | BYTE | DQMU | N.C | P |
| N | SDA9 | SDA10 | FA11 | FA12 | FA13 | Vss-SD | Vcc-SD | VssQ | VccQ | FDQ15 | FDQ14 | FDQ13 | FDQ12 | SDDQ15 | SDDQ14 | N |
| M | SDA7 | SDA8 | FA10 | | | | | | | | | FDQ11 | FDQ10 | SDDQ13 | SDDQ12 | M |
| L | | | | WE-SD | CS2 | FA8 | VccQ | VssQ | F9 | | | FDQ10 | VssQ | VccQ | | L |
| K | | | | CKE2 | CS1 | FA7 | | | | | | FDQ9 | SDDQ11 | SDDQ10 | | K |
| J | | | | CKE1 | CLK | | VssQ | | | | | FDQ8 | SDDQ9 | SDDQ8 | | J |
| H | | | | Vcc-SD | Vss-SD | | VccQ | | | | | FDQ7 | Vss-SD | Vcc-SD | | H |
| G | | | | RAS | CAS | FA6 | | | | | | FDQ6 | SDDQ7 | SDDQ6 | | G |
| F | | | | | | | | | | | | FDQ5 | SDDQ5 | SDDQ4 | | F |
| E | | | | VccQ | VssQ | FA5 | | | | | | FDQ4 | VssQ | VccQ | | E |
| D | SDA5 | SDA6 | FA4 | | | | | | | | | FDQ3 | SDDQ3 | SDDQ2 | D |
| C | SDA3 | SDA4 | FA3 | FA2 | FA1 | FA0 | Vss-SD | Vcc-SD | VssQ | VccQ | FDQ0 | FDQ1 | FDQ2 | SDDQ1 | SDDQ0 | C |
| B | N.C | SDA2 | SDA1 | Vss-SD | WP/ACC | WE-F | VssQ | Vss-SD | VssQ | Vss-F | N.C | N.C | Vss-SD | DQML | N.C | B |
| A | N.C | N.C | SDA0 | Vcc-SD | RDY | RESET | VccQ | Vcc-SD | VccQ | Vcc-F | N.C | CE | OE | N.C | N.C | A |
| | 15 | 14 | 13 | 12 | 11 | 10 | 9 | 8 | 7 | 6 | 5 | 4 | 3 | 2 | 1 | |

FIG. 11

| PAD NO. | PAD NAME | PAD NO. | PAD NAME |
|---|---|---|---|
| 1 | VSS | 37 | VCC |
| 2 | – | 38 | VCC |
| 3 | – | 39 | DQ8 |
| 4 | – | 40 | DQ7 |
| 5 | VCC | 41 | VCCQ |
| 6 | VCC | 42 | VSSQ |
| 7 | VSS | 43 | DQ9 |
| 8 | – | 44 | DQ6 |
| 9 | VSS | 45 | DQ10 |
| 10 | A3 | 46 | DQ5 |
| 11 | A4 | 47 | VSSQ |
| 12 | A2 | 48 | VCCQ |
| 13 | A5 | 49 | DQ11 |
| 14 | A1 | 50 | DQ4 |
| 15 | A6 | 51 | VSS |
| 16 | A0 | 52 | VCC |
| 17 | A7 | 53 | DQ12 |
| 18 | A10 | 54 | DQ3 |
| 19 | A8 | 55 | VCCQ |
| 20 | A9 | 56 | VSSQ |
| 21 | A12 | 57 | DQ13 |
| 22 | VSS | 58 | DQ2 |
| 23 | VCC | 59 | DQ14 |
| 24 | A13 | 60 | DQ1 |
| 25 | A11 | 61 | VSSQ |
| 26 | CS | 62 | VCCQ |
| 27 | CKE | 63 | DQ15 |
| 28 | RAS | 64 | DQ0 |
| 29 | CLK | 65 | VSS |
| 30 | CAS | 66 | – |
| 31 | WE | 67 | VCC |
| 32 | DQMU | 68 | VCC |
| 33 | – | 69 | – |
| 34 | DQML | 70 | – |
| 35 | VSS | 71 | – |
| 36 | VSS | 72 | VSS |

FIG. 13

| TERMINAL NO. | TERMINAL NAME |
|---|---|
| 1 | A15 |
| 2 | A14 |
| 3 | A13 |
| 4 | A12 |
| 5 | A11 |
| 6 | A10 |
| 7 | A9 |
| 8 | A8 |
| 9 | A19 |
| 10 | A20 |
| 11 | /WE |
| 12 | /RESET |
| 13 | WP#/ACC |
| 14 | RDY/BUSY |
| 15 | A18 |
| 16 | A17 |
| 17 | A7 |
| 18 | A6 |
| 19 | A5 |
| 20 | A4 |
| 21 | A3 |
| 22 | A2 |
| 23 | A1 |
| 24 | A0 |
| 25 | /CE |
| 26 | VSS |
| 27 | /OE |
| 28 | DQ0 |
| 29 | DQ8 |
| 30 | DQ1 |
| 31 | DQ9 |
| 32 | DQ2 |
| 33 | DQ10 |
| 34 | DQ3 |
| 35 | DQ11 |
| 36 | VCC |
| 37 | DQ4 |
| 38 | DQ12 |
| 39 | DQ5 |
| 40 | DQ13 |
| 41 | DQ6 |
| 42 | DQ14 |
| 43 | DQ7 |
| 44 | DQ15/A-1 |
| 45 | VSS |
| 46 | /BYTE |
| 47 | A16 |

US 6,815,746 B2

SEMICONDUCTOR DEVICE AND METHOD OF MANUFACTURING THE SAME

BACKGROUND OF THE INVENTION

The present invention relates to a semiconductor device and an electronic device with the semiconductor device built therein, and to, for example, a technology effective for application to a system memory module with a plurality of memory semiconductor chips (memory chips) built therein, and an electronic device with the system memory module built therein, e.g., an electronic device such as a personal digital assistant (PDA) or the like.

Electronic devices like a personal digital assistant, and a cellular telephone need a further size reduction and higher functioning. It is desirable to build a memory module (system memory module) having much larger capacity in these devices with increases in communications information thereof. As package forms for semiconductor devices adapted to such multi-functioning/densification, there are known package structures such as a BGA (Ball Grid Array), a CSP (Chip Size Package), etc.

As one method for manufacturing these BGA and CSP or the like, there has been known a method of mounting semiconductor chips (semiconductor elements) to predetermined locations or points on a main surface of a wiring board after the preparation of the wiring board (substrate), connecting electrodes of the semiconductor chips and wirings on the main surface of the wiring board by conductive wires, and thereafter covering the main surface side of the wiring board with an insulating encapsulating resin, and further providing protruded electrodes (bump electrodes) connected to respective wirings on the back surface of the wiring board to thereby fabricate a semiconductor device.

As a technology for downsizing the semiconductor device in the semiconductor manufacturing method, there is known a block molding method. The block molding method is a semiconductor manufacturing method including steps of mounting or packaging semiconductor chips on respective product forming areas of a wiring board having a plurality of the product forming areas, thereafter placing the wiring board within a molding die (forming die) having a large cavity, for covering the plurality of product forming areas, block-encapsulating the plurality of product forming areas with an encapsulating resin, and thereafter block-cutting an encapsulater and the wiring board by a dicing device to bring them into fractionization. The block molding method has been described in, for example, Unexamined Patent Publication No. 2000-12578 (U.S. Pat. No. 6,200,121).

SUMMARY OF THE INVENTION

Various semiconductor devices (ICs) have been built in the personal digital assistant (PDA). For example, a central processing unit (CPU), an application specific integrated circuit (ASIC), a synchronous dynamic random access memory (SDRAM: Synchronous Dynamic Random Access Memory) used as a memory, a flash memory, etc. are mounted on a printed circuit board (wiring board). Most of them are respectively mounted on the printed circuit board as single items. Therefore, the whole packaging area of these semiconductor devices increases and hence this interferes with the scale down of the electronic device such as PDA or the like. Each individual packaging of the semiconductor devices in the electronic device will produce a suspicion that the length of each of wirings for connecting between external electrode terminals of each semiconductor device becomes long, and bring about a possibility that a reduction in signal transfer speed and the like will occur.

On the other hand, an example (MCP: Multi Chip Package) in which a static memory (SRAM: Static Random Access Memory) and a flash memory (flash nonvolatile memory) used as memories are built in a single package, has been commercialized by various manufacturers. However, the example with the SDRAM and the flash memory integrated into one has not heretofore been attained. A main application for the MCP commercialized up to now is a memory for a cellular phone. This is because the SRAM low in power consumption as compared with the SDRAM is used in the cellular phone. However, since the PDS needs a memory having larger capacity, the SDRAM other than the SRAM is used.

An object of the present invention is to provide a small-sized and inexpensive semiconductor device wherein a dynamic random access memory such as a synchronous dynamic random access memory and a flash memory are built in a single encapsulater.

Another object of the present invention is to provide an electronic device capable of high-speed operation and downsizing.

The above, other objects and novel features of the present invention will become apparent from the description of the present specification and the accompanying drawings.

Summaries of typical ones of the inventions disclosed in the present application will be described in brief as follows:

(1) There is provided a semiconductor device, comprising:

a wiring board having a main surface, an insulating film formed on the main surface, and a plurality of electrodes formed on the main surface, the wiring board having external electrode terminals formed on a back surface used as a reverse side of the main surface;

semiconductor chips each having a main surface and a back surface and having one or more semiconductor elements and a plurality of electrodes formed on the main surface, the back surface being fixed to the main surface of the wiring board face to face therewith with an adhesive interposed therebetween;

conductive wires which connect electrodes on the main surface of the wiring board to electrodes of each semiconductor chip; and an encapsulater which covers the semiconductor chips, the main surface of the wiring board and the electrodes, wherein at least one dynamic random access memory chip with a dynamic random access memory built therein and at least one flash memory chip with a flash memory built therein are fixed to the wiring board as the semiconductor chips, and the encapsulater and the wiring board respectively have side faces cut by dicing.

Described specifically, a flash memory chip and a dynamic random access memory chip both formed as rectangular are respectively fixed to the main surface of the wiring board side by side in a state in which a plurality of electrodes on their surfaces are being exposed and in such a manner that long sides thereof are respectively placed face to face with one another, the flash memory chip includes a plurality of electrodes arranged along edges of short sides thereof, a dynamic random access memory chip shorter than the flash memory chip is fixed onto the flash memory chip in a state in which the plurality of electrodes provided along both short sides of the flash memory chip are being exposed, and the dynamic random access memory chip fixed to the main surface of the wiring board and the dynamic random access memory chip on the flash memory chip are identical in size and structure.

Address/data buses are connected to common electrodes among a plurality of the dynamic random access memory chips, and address/data buses are separated between the dynamic random access memory chip and the flash memory chip and connected to electrodes different from each other.

The electrodes of the flash memory chip are respectively disposed side by side in a row along edges of both short sides thereof, the electrodes of the dynamic random access memory chip are disposed side by side along a long side thereof, the address electrodes are larger in number than the data electrodes in an electrode row of one short side of the flash memory chip, and the data electrodes are larger in number than the address electrodes in an electrode row of the other short side of the flash memory chip, the address electrodes are larger in number than the data electrodes in a half electrode row closed to one short side of the flash memory chip with respect to distributions of the address electrodes and data electrodes in the electrode rows of the dynamic random access memory chip, and the data electrodes are larger in number than the address electrodes in a half electrode row closed to the other short side of the flash memory chip.

Further, power supplies are separated between the dynamic random access memory chip and the flash memory chip.

According to the means of (1) referred to above, (a) since a dynamic random access memory such as a synchronous dynamic random access memory or the like and a flash memory can be incorporated into a single encapsulater, it is possible to achieve downsizing of a semiconductor device and achieve even a reduction in the cost of the semiconductor device.

(b) The shortening of a wiring length is also enabled from the above (1), and an increase in the operating speed of the semiconductor device can be achieved.

(c) Since the address/data buses are connected to the common electrodes among the plurality of dynamic random access memory chips, and the address/data buses are separated between the dynamic random access memory chip and the flash memory chip and connected to the electrodes different from each other, characteristic measurements are made easy.

(d) The address electrodes and data electrodes for the dynamic random access memory chip and flash memory chip are respectively disposed on the same area sides in the dynamic random access memory chip and the flash memory chip, the design of layout of wirings on a printed circuit board becomes easy.

(e) Since the power supplies are separated between the dynamic random access memory chip and the flash memory chip, noise is lightened.

There is provided an electronic device, comprising:

input means;

a central processing unit which executes various processes, based on signals inputted by the input means;

a semiconductor device which is connected to the central processing unit and stores information therein;

display means which is connected to the central processing unit and displays an image under control of the central processing unit;

voice display means which is connected to the central processing unit and outputs voice under control of the central processing unit; and a battery which drives the respective means;

the semiconductor device including, a wiring board having a main surface, an insulating film formed on the main surface, and a plurality of electrodes formed on the main surface, the wiring board having external electrode terminals formed on a back surface used as a reverse side of the main surface;

semiconductor chips each having a main surface and a back surface and having one or more semiconductor elements and a plurality of electrodes formed on the main surface, the back surface being fixed to the main surface of the wiring board face to face therewith with an adhesive interposed therebetween;

conductive wires which connect electrodes on the main surface of the wiring board to electrodes of the each semiconductor chip; and an encapsulater which covers the semiconductor chips, the main surface of the wiring board and the electrodes, wherein at least one dynamic random access memory chip with a dynamic random access memory built therein and at least one flash memory chip with a flash memory built therein are fixed to the wiring board as the semiconductor chips.

Preferably, according to the electronic device, in the semiconductor device, a plurality of the semiconductor chips are respectively fixed in a superposed form to the main surface of the wiring board in a state in which a plurality of electrodes on the surfaces thereof are being exposed.

Preferably, according to the electronic device, in the semiconductor device, a flash memory chip and a dynamic random access memory chip both formed as rectangular are respectively fixed to the main surface of the wiring board side by side in a state in which a plurality of electrodes on their surfaces are being exposed and in such a manner that long sides thereof are respectively placed face to face with one another, the flash memory chip includes a plurality of electrodes arranged along edges of short sides thereof, a dynamic random access memory chip shorter than the flash memory chip is fixed onto the flash memory chip in a state in which the plurality of electrodes provided along both short sides of the flash memory chip are being exposed, the exposed electrodes and a plurality of the electrodes on the wiring board are connected by the wires, and the dynamic random access memory chip fixed to the main surface of the wiring board and the dynamic random access memory chip on the flash memory chip are identical in size and structure.

Preferably, according to the electronic device, in the semiconductor device, clock electrodes connected with wires are disposed on the main surface of the wiring board between the two dynamic random access memory chips aligned adjacent to each other, and the clock electrodes, and the clock electrodes for the two dynamic random access memory chips are connected to one another by wires.

Preferably, according to the electronic device, in the semiconductor device, address/data buses are connected to common electrodes among a plurality of the dynamic random access memory chips, and address/data buses are separated between the dynamic random access memory chip and the flash memory chip and connected to electrodes different from each other.

Preferably, according to the electronic device, in the semiconductor device, a first area on the main surface of the wiring board is an area in which address electrodes are larger in number than data electrodes, a second area thereon is an area in which data electrodes are larger in number than address electrodes, and distributions of address electrodes and data electrodes of the respective semiconductor chips some of which are disposed close to the first and second areas, also correspond to distributions at the wiring board.

Preferably, according to the electronic device, in the semiconductor device, the electrodes of the flash memory chip are respectively disposed side by side in a row along edges of both short sides thereof, the electrodes of the dynamic random access memory chip are disposed side by side along a long side thereof, the address electrodes are larger in number than the data electrodes in an electrode row of one short side of the flash memory chip, and the data electrodes are larger in number than the address electrodes in an electrode row of the other short side of the flash memory chip, the address electrodes are larger in number than the data electrodes in a half electrode row closed to one short side of the flash memory chip with respect to distributions of the address electrodes and data electrodes in the electrode rows of the dynamic random access memory chip, and the data electrodes are larger in number than the address electrodes in a half electrode row closed to the other short side of the flash memory chip.

Preferably, according to the electronic device, in the semiconductor device, power supplies are separated between the dynamic random access memory chip and the flash memory chip.

Preferably, according to the electronic device, in the semiconductor device, the dynamic random access memory chip is a synchronous dynamic random access memory chip.

Preferably, the electronic device constitutes a personal digital assistant.

BRIEF DESCRIPTION OF THE DRAWINGS

FIG. 5 is an enlarged sectional view taken along line A—A of FIG. 1;

FIG. 6 is an enlarged sectional view taken along line B—B of FIG. 1;

FIG. 8 is a typical diagram illustrating functions of electrodes in the bump electrode array;

FIG. 11 is a tabular representation showing functions of respective electrodes of the flash memory chip;

FIG. 13 is a tabular representation showing functions of respective electrodes of the dynamic random access memory chip;

DETAILED DESCRIPTION OF THE PREFERRED EMBODIMENTS

Figure 1:
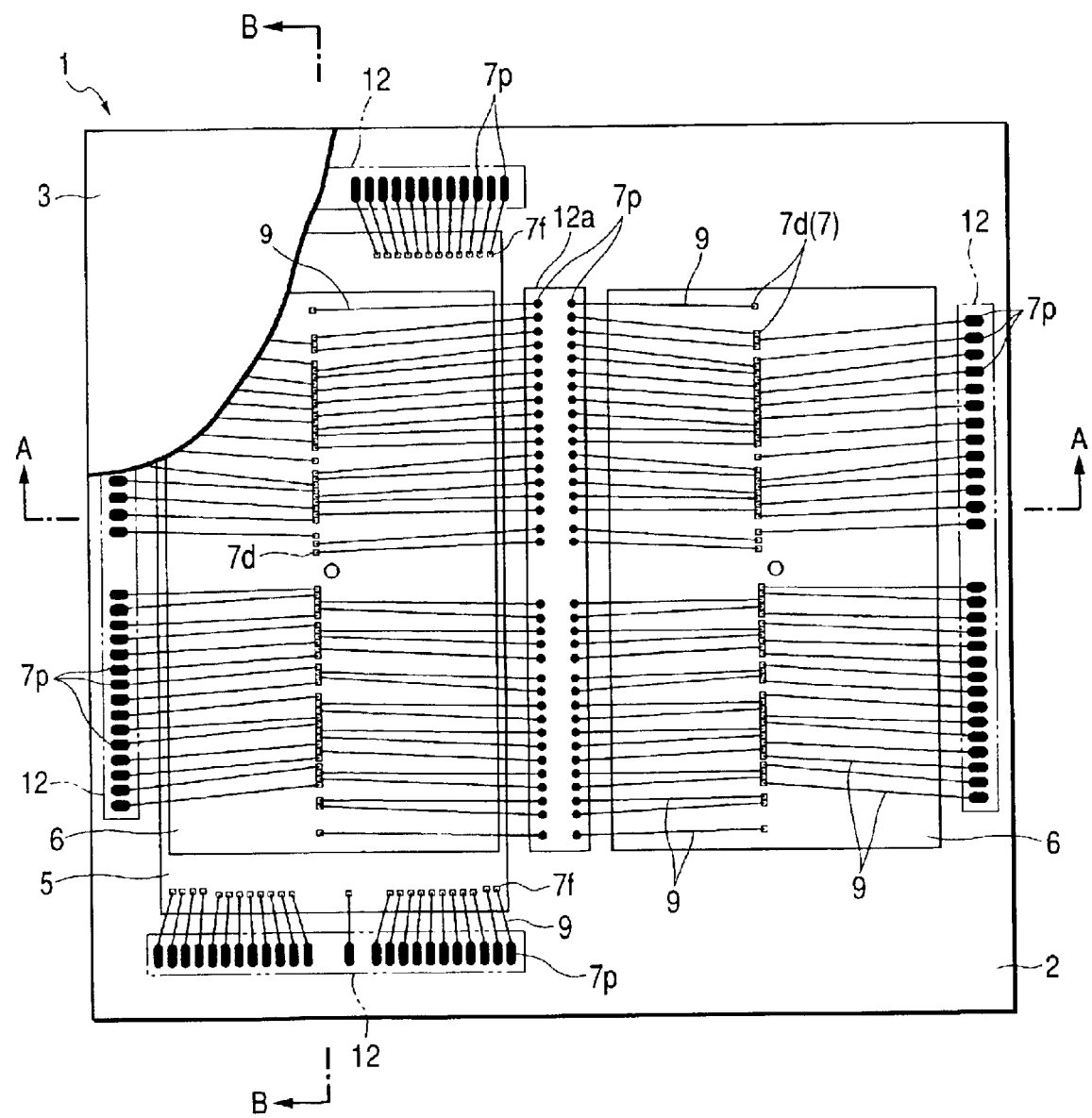
FIG. 1 is a typical plan view of a partly-cutaway system memory module showing one embodiment (embodiment 1) of the present invention.

Preferred embodiments of the present invention will hereinafter be described in detail with reference to the accompanying drawings. Incidentally, components each having the same function in all the drawings for describing the embodiments of the present invention are respectively identified by the same reference numerals and their repeated description will therefore be omitted.

(Embodiment 1)

FIGS. 1 through 36 are respectively diagrams related to a BGA type semiconductor device (system memory module) showing one embodiment (embodiment 1) of the present invention. FIGS. 1 through 6 are respectively diagrams related to a structure of the semiconductor device, and FIGS. 7 through 14 are respectively diagrams for describing functions and an arrangement of respective bump electrodes at the bottom face of the semiconductor device and electrode arrangements or the like of semiconductor chips.

Figure 2:
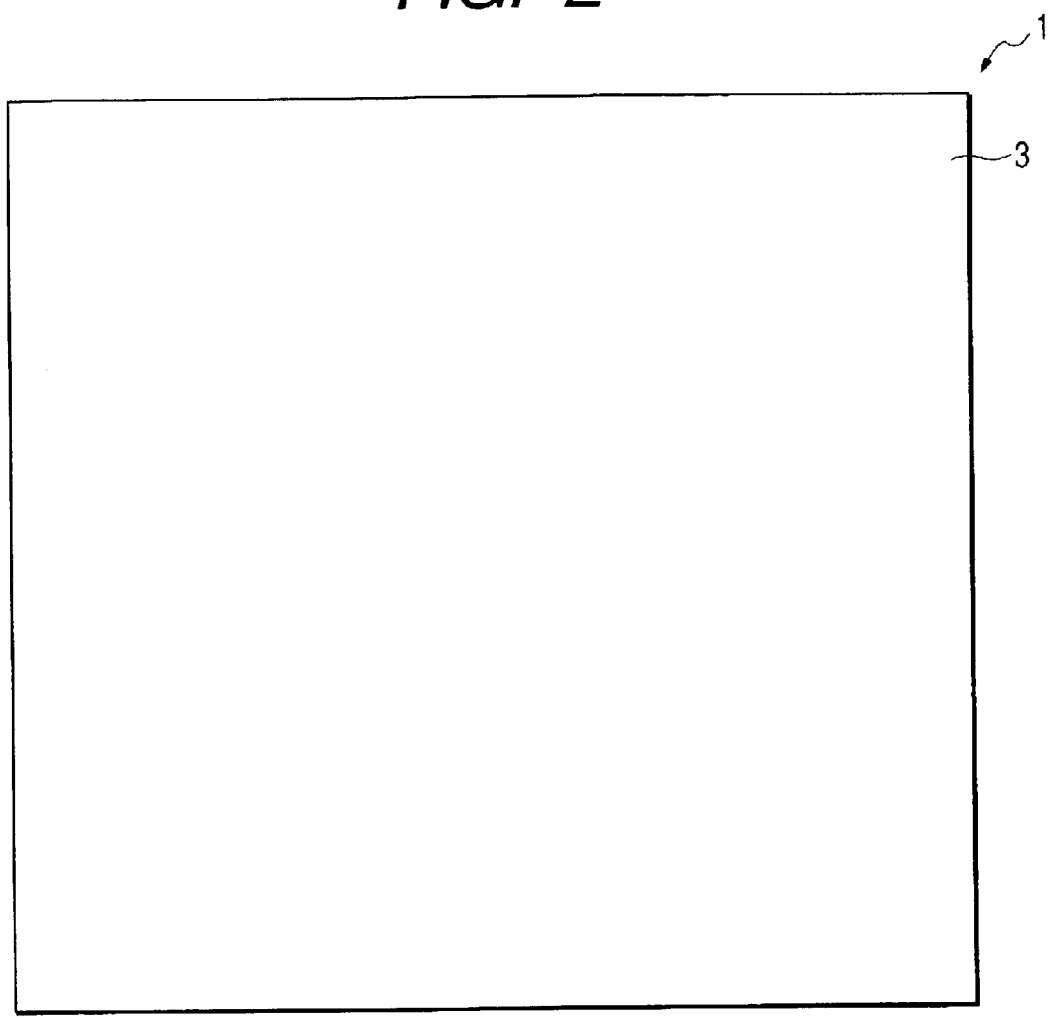
FIG. 2 is a plan view of a system memory module fabricated by a method of manufacturing a semiconductor device according to the present embodiment 1.
Figure 3:
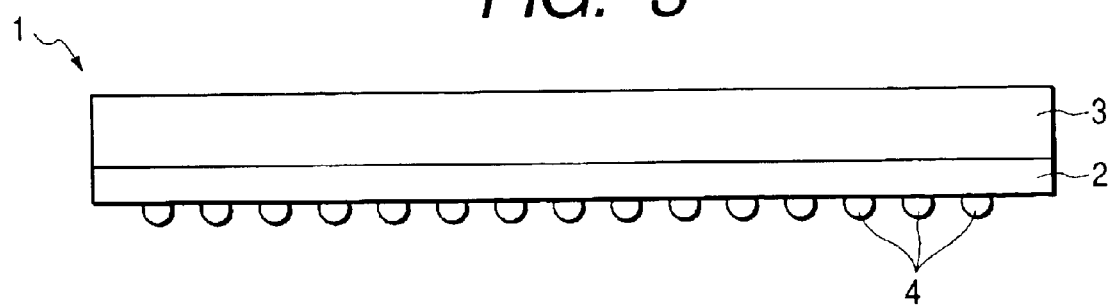
FIG. 3 is a side view of the system memory module according to the present embodiment 1.
Figure 4:
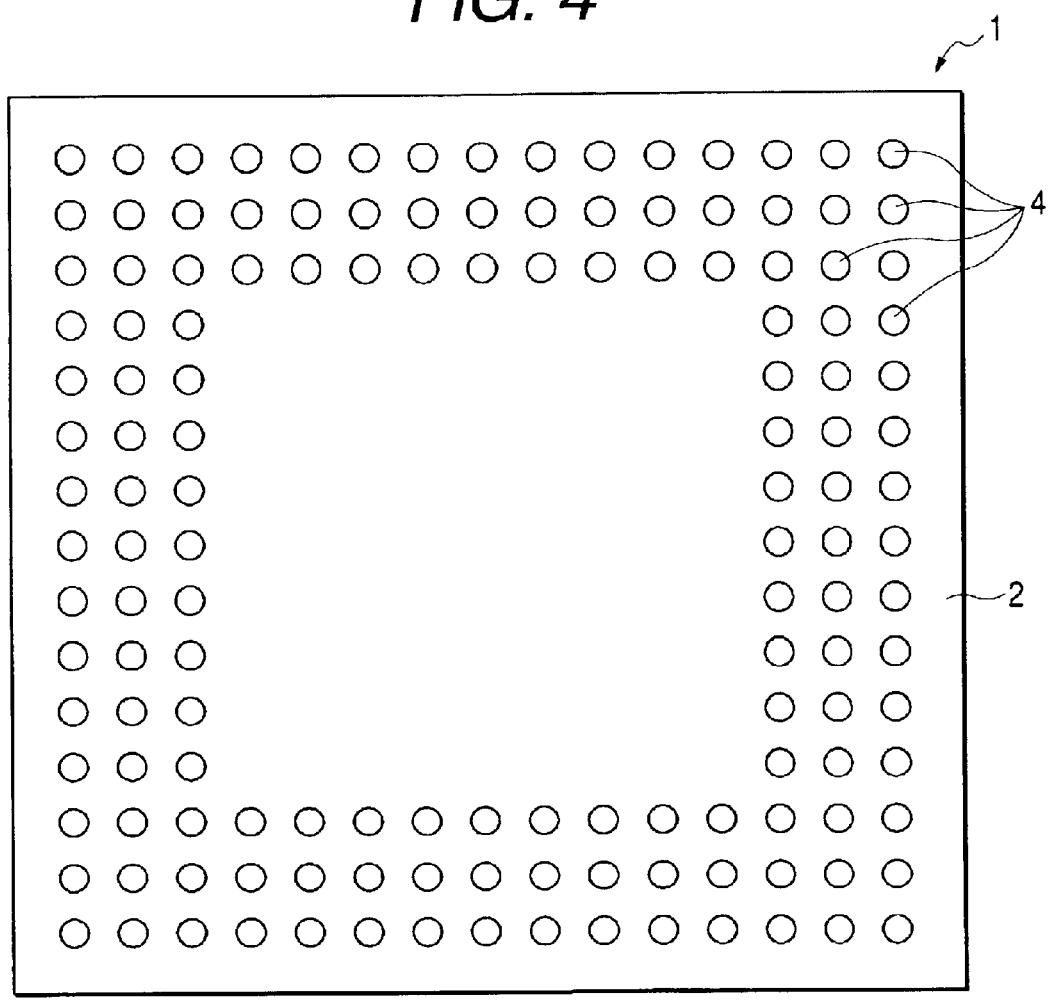
FIG. 4 is a bottom view of the system memory module according to the present embodiment 1.

The semiconductor device (system memory module) 1 according to the present embodiment 1 has such a structure as shown in FIGS. 1 through 7. FIG. 1 is a plan view of the semiconductor device in which an encapsulater is partly cut away, FIG. 2 is a plan view of the semiconductor device, FIG. 3 is a side view of the semiconductor device, and FIG. 4 is a bottom view of the semiconductor device, respectively.

In the present embodiment 1, an example in which one flash memory chip and two dynamic random access memory chips are built in a single encapsulater, will be explained as a system memory module. The flash memory chip is a semiconductor chip with a 32-Mbit flash memory built therein, whereas each of the dynamic random access memory chips is a synchronous dynamic random access memory chip with a 64-Mbit synchronous dynamic random access memory built therein. FIG. 1 is a typical diagram showing the state of layout of the three semiconductor chips, and conductive wires for connecting electrodes of these semiconductor chips and electrodes of a wiring board.

As shown in FIGS. 1 through 4, the semiconductor device (system memory module) 1 has, in appearance, a square and plate-shaped wiring board 2 (see FIGS. 1, 3 and 4), an encapsulater (package) 3 having the same outer dimensions as the wiring board 2, which is superimposed on a main surface (upper surface in FIG. 3) of the wiring board 2, and a plurality of protruded electrodes (bump electrodes) 4 provided on the back surface (lower surface in FIG. 3) corresponding to a surface opposite to the main surface of the wiring board 2. The bump electrodes 4 are arranged in line (in an array form).

In the present embodiment 1, the bump electrodes 4 are provided in the form of a frame-shaped array configuration wherein they are aligned in three rows along the longitudinal and transverse sides of the square wiring board 2. The numbers of the outermost-peripheral bump electrodes 4 arranged along the respective sides result in 15 respectively. The number (number of pins) of the whole bump electrodes 4 reaches 144 pins. The package 3 is made up of an insulating resin having a constant thickness and its peripheral surface is formed by cutting a block encapsulater formed by block encapsulation by dicing upon manufacture. Therefore, the peripheral surface results in a surface cut by dicing. When the block encapsulater is cut by a blade having a constant thickness although the peripheral surface of the package 3 varies according to the shape of a blade at dicing, its cut surface, i.e., the peripheral surface of the package 3 results in a surface normal to the main surface of the wiring board 2 as shown in FIG. 3.

In the system memory module 1 according to the present embodiment 1, a flash memory chip 5 and a synchronous dynamic random access memory chip (SDRAM chip) 6 both shaped in the form of a rectangle, are respectively fixed to the main surface of the wiring board 2 side by side in parallel in a state in which a plurality of electrodes 7f and 7d on the surfaces thereof are being exposed and in such a manner that their long sides are provided face to face with each other. Another SDRAM chip 6 is fixed onto the flash memory chip 5. The system memory module 1 can be reduced in size owing to such lamination fixing.

The flash memory chip 5 has a structure wherein a plurality of electrodes 7f are arranged in a row along the edge of each short side thereof. The long side of the flash memory chip 5 is longer than the long side of the SDRAM chip 6. When the SDRAM chip 6 is fixed onto the flash memory chip 5, the electrodes 7f provided along both short sides of the flash memory chip 5 can be exposed out of the SDRAM chip 6.

Thus, the respective electrodes 7f arranged along both short sides of the flash memory chip 5, and the electrodes 7p provided on the main surface of the wiring board 2 can be connected to one another by conductive wires 9.

The SDRAM chip 6 fixed to the main surface of the wiring board 2 and the SDRAM chip 6 fixed onto the flash memory chip 5 are identical in size and structure. Further, the electrodes 7d provided on the SDRAM chips 6 are disposed side by side along their long sides. Namely, the electrodes 7d of the SDRAM chip 6 are provided so as to take such a center-line layout configuration that they are arranged in a row from the center of one short side of the SDRAM chip 6 to the center of the other short side thereof. The electrodes 7p are provided on the main surface of the wiring board 2 on both sides of fixed areas of the SDRAM chips 6 so as to extend along the edges of the SDRAM chips 6.

One ends of the wires 9 are respectively connected to the electrodes 7d having the center-line layout configuration. These wires 9 are divided from side to side, and the other one ends thereof are respectively connected to the electrodes 7p on the main surface of the wiring board 2, which are disposed on both sides of each SDRAM chip 6. While wire-connecting electrodes 7p lying between the SDRAM chip 6 and the flash memory chip 5 are shown in two rows in FIG. 1, the leading ends of the wires 9 extending from the electrodes 7d of the right-and-left SDRAM chips 6 are actually connected to both ends of slender electrodes 7p (see FIG. 5). Assuming that portions connected to the electrodes of each semiconductor chip are represented as first bonding points upon wire bonding, portions connected to the electrodes on the wiring board are represented as second bonding points. In FIG. 1, the electrodes 7p on the wiring board 2 indicate the second bonding points respectively.

The system memory module 1 according to the present embodiment 1 has a structure wherein the 32-Mbit flash memory chip 5 and the two 64-Mbit SDRAM chips 6 are built in the single package 3, and has outer dimensions which are 13 mm long, 13 mm wide and 1.5 mm in height. As the bump electrodes 4, solder balls each having a diameter of 0.35 mm are used. The length of each bump electrode 4 that protrudes from the wring board 2, results in about 0.25 mm. Further, the pitch of each bump electrode 4 becomes 0.8 mm.

Cross sections of a specific system memory module 1 are shown using FIGS. 5 and 6. FIG. 5 is an enlarged cross-sectional view taken along line A—A of FIG. 1, and FIG. 6 is an enlarged cross-sectional view taken along line B—B of FIG. 1, respectively.

As shown in FIGS. 5 and 6, a wiring board 2 comprises a multilayer structure wherein wirings 7 each shaped in a predetermined pattern are provided on a main surface and a back surface of a wiring board 1 and in one or more middle layers, and upper and lower wirings 7 are electrically connected to one another by conductors 7a (wirings) charged into through holes. The wring board 2 serves as a 4-layer BT (bismaleimide triazine) substrate having a thickness of about 0.2 mm, for example. The wirings 7 constitute electrodes 7p for connecting wires 9 on the main surface of the wiring board 1, and electrodes 7c used as bases for fixing bump electrodes 4 are provided on the back surface of the wiring board 1.

Since the two semiconductor chips are mounted on the main surface of the wiring board 2 as already described above, the electrodes 7p for connecting the wires are disposed around chip mounting areas for mounting these semiconductor chips.

Insulating films (solder resists) 10 and 11 are respectively formed on the main surface (upper surface) and back surface of the wiring board 2 as predetermined patterns so as to cover the wirings and the like. The electrodes 7p on the main surface of the wiring board have such structures that they are exposed so as to be capable of wire bonding, whereas the electrodes 7c on the back surface of the wiring board have such structures that they are exposed to fix the bump electrodes 4. Therefore, the insulating films 10 and 11 on the main surface side of the wiring board 2 have such structures that constant widths are cut away to define open grooves 12 and the electrodes 7p are exposed at the bottoms of the open grooves 12 (see FIG. 1).

The two second bonding points are exposed within an open groove 12a defined in the main surface of the wiring board 2 between the right and left SDRAM chips 6 so that the other ends of the wires 9 whose one ends are connected to their corresponding electrodes 7d of the SDRAM chips 6 as viewed on the right and left sides of the open groove 12a, are both connected thereto. Namely, the second bonding points for wire bonding are arranged within the open groove 12a in two rows along its extending direction. As to the second bonding points, both ends of the single long electrodes 7p are actually used as the second bonding points.

As shown in FIGS. 5 and 6, a flash memory chip 5 and a SDRAM chip 6 shaped in a rectangular form are respectively fixed onto the insulating film 10 on the main surface of the wiring board 2 with adhesives 13 interposed therebetween, in parallel such that their long sides are opposite to one another. Further, a SDRAM chip 6 is fixed onto the flash memory chip 5 with an adhesive 14 similar to the above interposed therebetween. The SDRAM chip 6 directly fixed to the wiring board 2, and the laminated SDRAM chip 6 fixed onto the flash memory chip 5 are both SDRAMs identical in size and function. They are 64-Mbit SDRAMs, for example. The adhesives 13 and 14 make use of non-conductive paste, e.g., insulating epoxy resin paste. After they have been adhered to one another, the adhesives 13 and 14 are subjected to hardening (baking) at a temperature of about 150° C., for example to reliably fix the semiconductor chips.

Both the flash memory chip 5 and the SDRAM chip 6 become rectangular. The width of the SDRAM chip 6, i.e., the short side thereof is slightly shorter than the width (short side) of the flash memory chip 5. Further, the long side of the flash memory chip 5 becomes longer than the long side of the SDRAM chip 6. When the center of the SDRAM chip 6 is superposed on the center of the flash memory chip 5 so as to coincide with each other, short-side portions at both ends of the flash memory chip 5 are located away from the SDRAM chip 6, and electrodes 7f provided at the short sides thereof are exposed to such an extent that they are capable of wire bonding sufficiently.

Thus, as shown in FIGS. 1 and 6, the SDRAM chip 6 is fixed onto the flash memory chip 5 with the adhesive 14 interposed therebetween in such a manner that the wiring bonding is made possible and the electrodes 7f on the sides of both short sides of the flash memory chip 5 are exposed. The electrodes of the SDRAM chip 6 are disposed in a row along its longitudinal direction and its center (center-line layout configuration: see FIG. 1).

A description will now be made of the reason why the electrodes 7f are arranged along the short sides of the flash memory chip 5 in the flash memory chip 5. As different from an SDRAM, a flash memory needs not to take into consideration a high-speed operation. Therefore, electrodes (pads) can be provided around a semiconductor chip to make in-chip wring lengths long and shorten wire lengths at wire bonding. When the semiconductor chip is rectangular in the case of the peripheral pads and the number of the pads is low, the pads can be provided at either long sides (long-side pads) or short sides (short-side pads).

When the pads are adopted as the long-side pads, the routing of wirings on the wiring board becomes very complex as compared with the case where the pads are adopted as the short-side pads. Therefore, the short-side pads are apt to be used although there are other reasons. Even in the present embodiment 1, the flash memory chip is adopted in which the short-side pads are arranged.

On the other hand, the respective electrodes 7f and 7d of the flash memory chip 5 and SDRAM chip 6 fixed to the wiring board 2 in parallel and the SDRAM chip 6 fixed onto the flash memory chip 5, and the electrodes on the wiring board 2 are respectively connected to one another by conductive wires, e.g., gold wires. Namely, the electrodes 7f and 7d of the flash memory chip 5 and two SDRAM chips 6, and the electrodes 7p of the wiring board 2 are connected to one another by their corresponding conductive wires 9 (see FIGS. 1, 5 and 6).

These three semiconductor chips and wires 9 or the like are covered with an encapsulater (package) 3 formed over the whole main surface of the wiring board. The package 3 is formed of an insulting resin. In a method of manufacturing the semiconductor device according to the present embodiment 1, three semiconductor chips are respectively mounted on respective product forming areas of a sheet of large wiring board. Thereafter, a block encapsulater or package made up of an insulating resin is formed to a constant thickness on the main surface side of the wiring board by a transfer molding device. Finally, the wiring board and the block encapsulater are formed by dicing at the boundaries of the respective product forming areas. Therefore, the side faces of the package 3 result in surfaces cut by dicing and result in surfaces normal to the main surface of the wiring board 2.

On the other hand, a plurality of protruded electrodes (bump electrodes) 4 are formed on the back surface (lower surface in FIGS. 5 and 6) corresponding to a surface opposite to the main surface of the wiring board 2. The bump electrodes 4 are solder bump electrodes formed of solder balls formed so as to be superposed on their corresponding electrodes 7c. As the solder balls, solder balls each having a diameter of 0.35 mm, for example are used, and the bump electrodes 4 protrude from the back surface of the wiring board 2 by about 0.25 mm. The bump electrodes 4 are provided in the form of a frame-shaped array configuration as described above.

Figure 7:
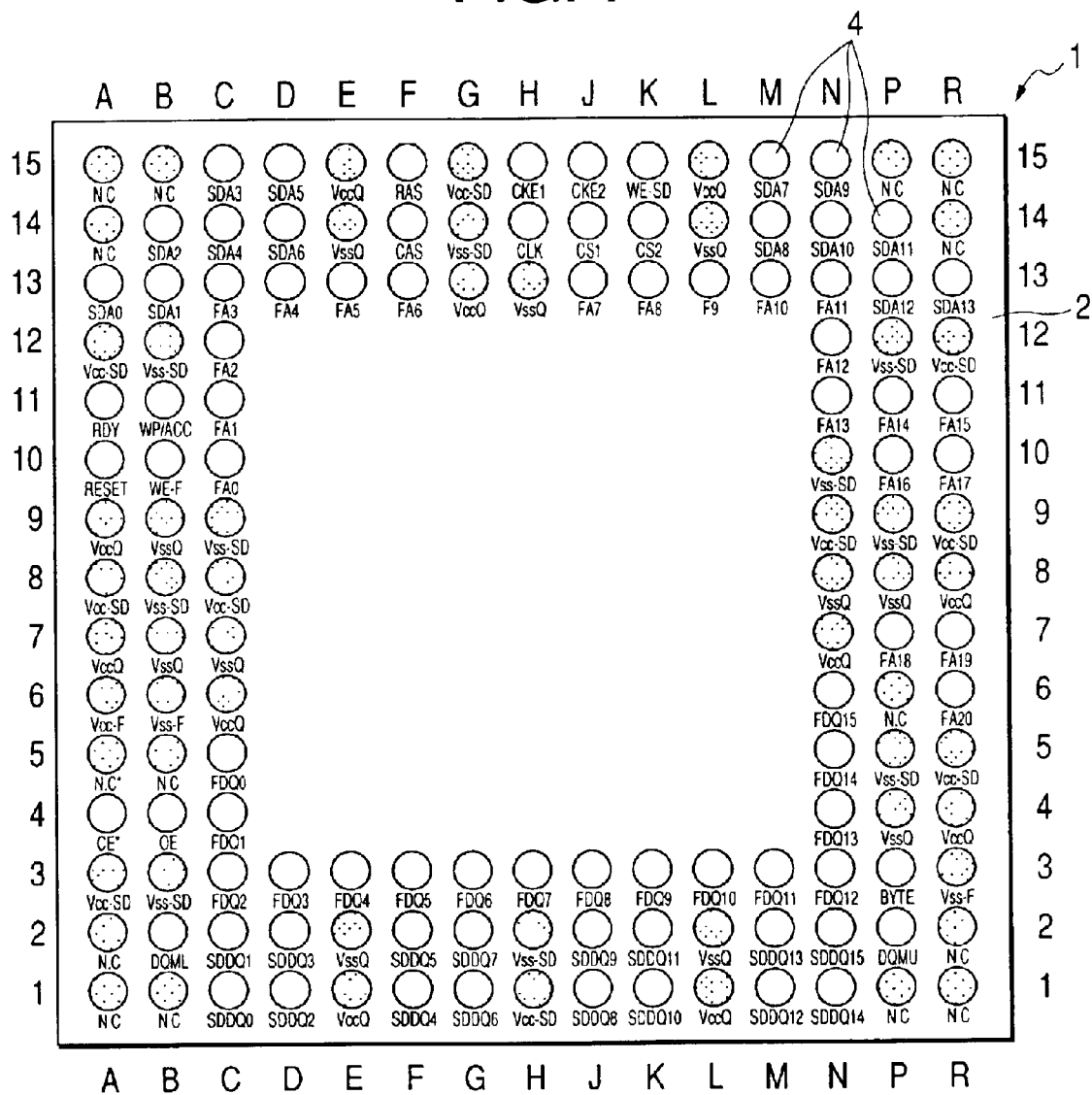
FIG. 7 is a typical diagram showing a bump electrode array of the system memory module according to the present embodiment 1 and functions thereof.

Functions and an arrangement or configuration of the respective bump electrodes 4 in the system memory module 1, and electrode arrangements or configurations or the like of the semiconductor chips will next be explained while referring to FIGS. 7 through 14. FIG. 7 is a typical diagram showing the configuration or arrangement and functions of the bump electrodes 4 of the system memory module 1 and a diagram seen through from above the package 3.

Figure 9:
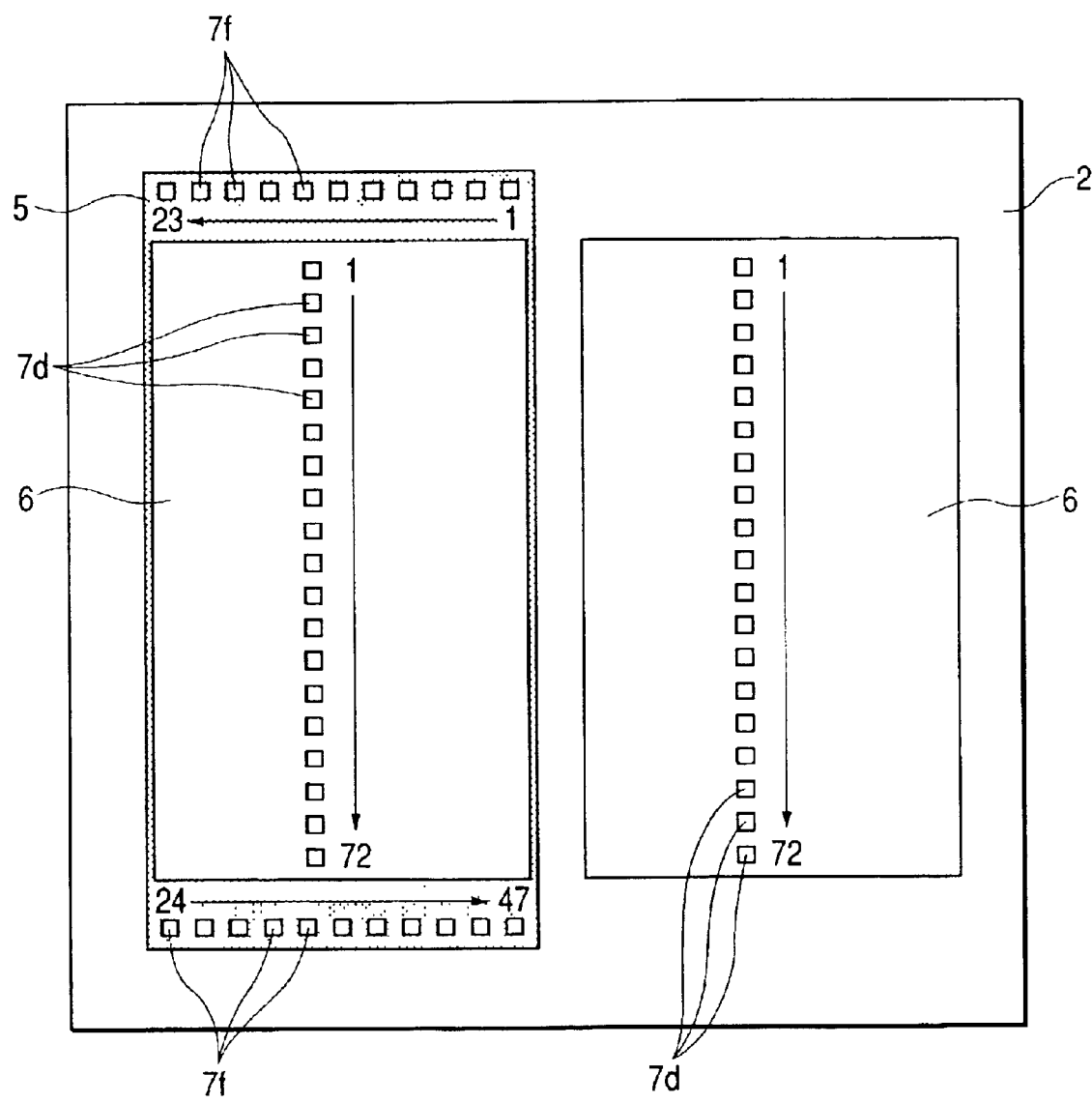
FIG. 9 is a typical diagram showing a layout state of three semiconductor chips employed in the system memory module according to the present embodiment 1.
Figure 10:
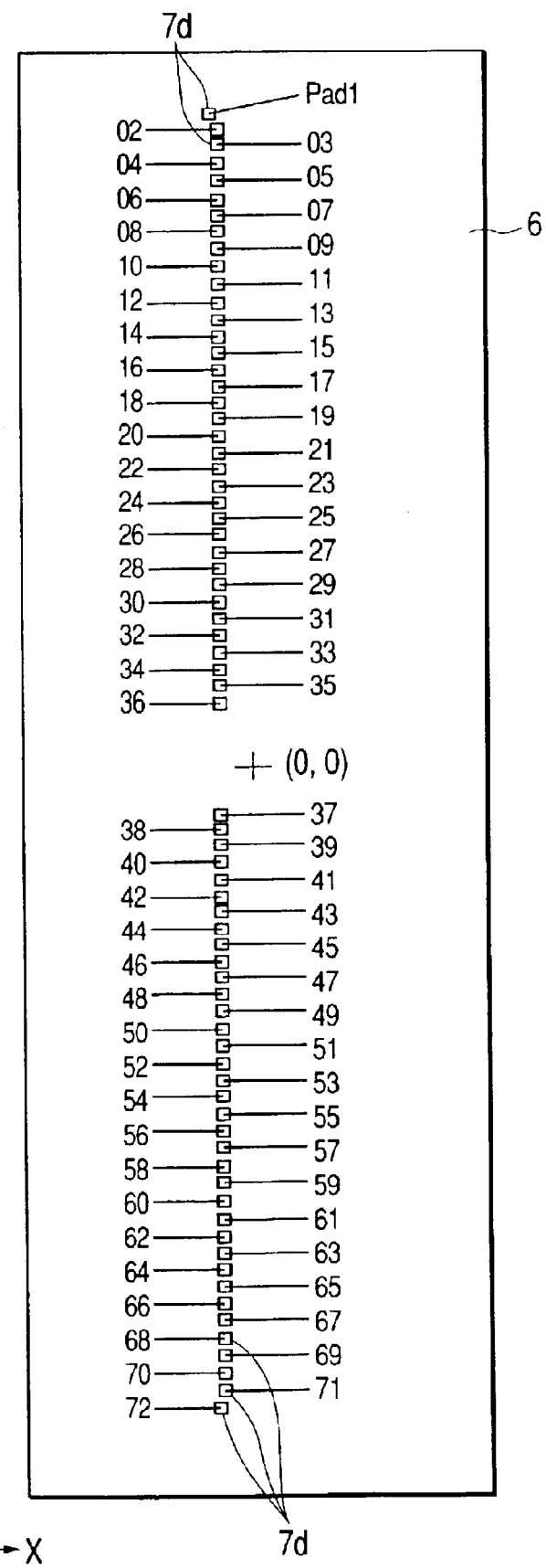
FIG. 10 is a typical plan view showing an electrode configuration of a flash memory chip built in the system memory module according to the present embodiment 1.
Figure 12:
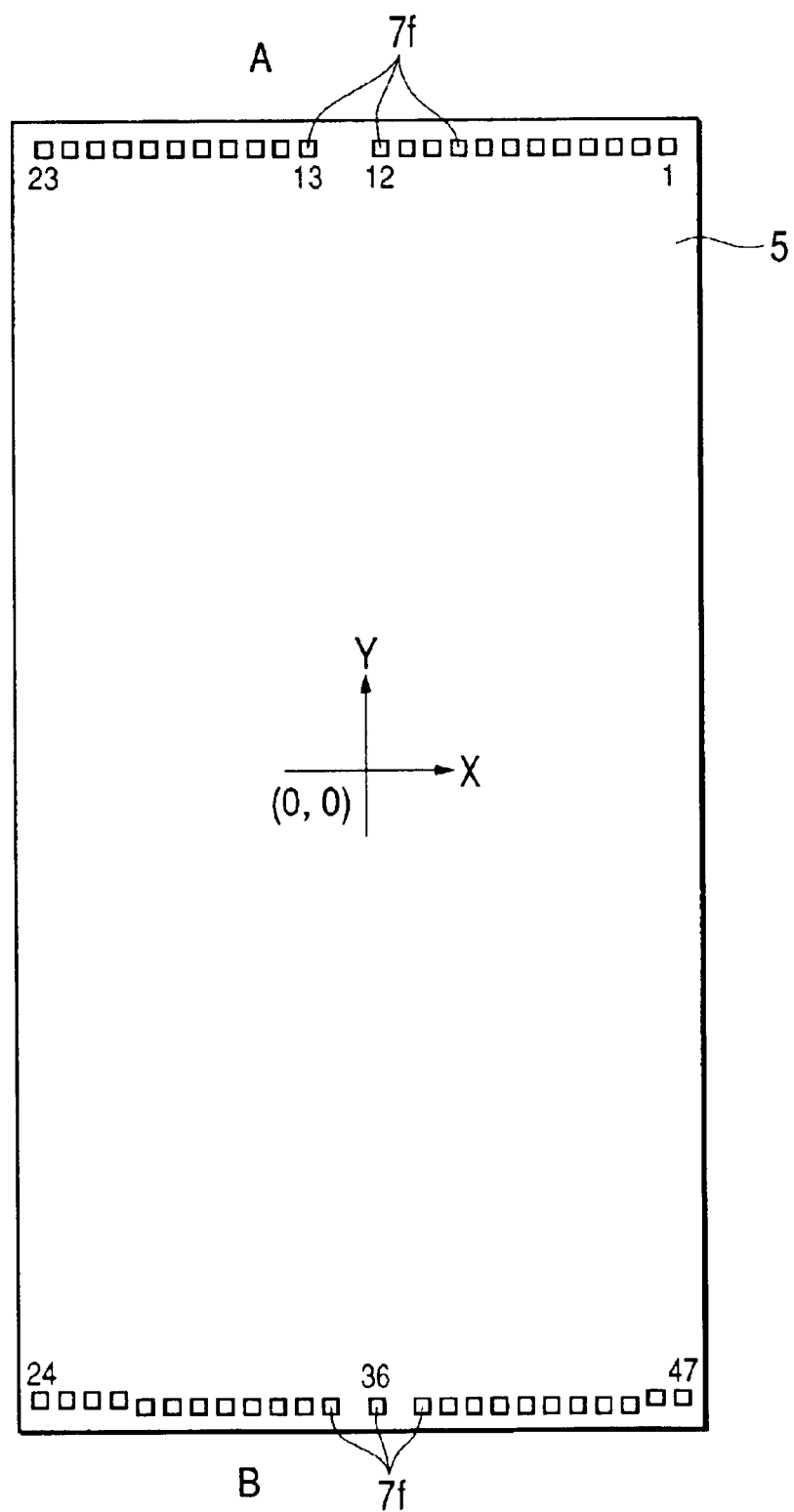
FIG. 12 is a typical plan view illustrating an electrode configuration of a dynamic random access memory chip built in the system memory module according to the present embodiment 1.

FIG. 9 is a typical diagram showing the state of layout of the three semiconductor chips in the system memory module 1 and pin configurations (numbers) thereof. FIG. 10 is a typical plan view showing electrode configurations (numbers) of a flash memory chip 5, and FIG. 11 is a tabular representation showing functions of respective electrodes (pads) of the flash memory chip, respectively. The names or designations of the respective electrodes designated at numerals 1 to 72 in the flash memory chip 5 are described in FIG. 11. FIG. 12 is a typical plan view showing an electrode configuration (terminal numbers) of a SDRAM chip 6, and FIG. 13 is a tabular representation showing functions (terminal names) of respective electrodes (terminals) designated at numeral 1 to 47 in the SDRAM chip 6, respectively.

As shown in FIG. 10, the SDRAM chip 6 has a shape that extends in a slender form. The electrodes designated at pads 1 to 72 are arranged side by side in a row so as to extend from the center (upper side in the drawing) of one short side to the center (lower side in the drawing) of the other short side. This electrode sequence or row results in an electrode group which increases in arrangement interval at its midpoint and is divided into two at it upper and lower portions. Incidentally, the pads 1 to 36 and the pads 37 to 72 are respectively defined as an A area and a B area here for convenience of description.

FIG. 11 is a tabular representation showing pad names (names indicative of pad's functions) of the pads 1 to 72. Power supply terminals such as Vcc, Vss, VccQ and VssQ, address terminals such as A0 to A13, data terminals such as DQ0 through DQ15, DQMU, DQML, etc., and control terminals such as CS, CKE, RAS, CLK, CAS, WE, etc. are described in the tabular representation.

A0 through A13 are disposed in the A area (pads 1 through 36) close to one short side as address electrodes. Data electrodes DQ0 through DQ15 are placed in the B area (pads 37 through 72) close to the other short side.

Thus, the number of the address electrodes becomes greater than that of the data electrodes in the A area, and the number of the data electrodes becomes larger than that of the address electrodes in the B area. As is understood from FIG. 1 as well, the electrodes 7p of the wiring board 2 are disposed around the respective chips so as to correspond to the respective electrodes of the flash memory chip 5 and the SDRAM chip 6 in close vicinity to them. Therefore, the number of the address electrodes becomes greater than that of the data electrodes even in the case of the electrodes 7p of the wiring board 2 on the A area side, whereas even in the case of the electrodes 7p of the wiring board 2 on the B area side, the number of the data electrodes increases as compared with that of the address electrodes.

Distributions of the address electrodes and data electrodes in such A and B areas are similar even in the case of the flash memory chip 5. FIG. 12 is a tabular presentation showing the names or designations (names indicative of pad's functions) of pads 1 through 47 in the flash memory chip 5. Power supply terminals such as Vcc, Vss, VccQ and VssQ, address terminals such as A0 to A20, data terminals such as DQ0 through DQ15, and /WE, /RESET, WP#/ACC, RDY/BUSY, /CE, /OE, /BYTE, etc. are described in the tabular presentation.

The flash memory chip 5 has a structure wherein electrodes 7f are respectively disposed in a row along the edges of respective rectangular short sides. The electrodes 7f designated at the pads 1 through 23 are arranged in the upper side (A area) shown in the drawing, whereas the electrodes 7f corresponding to the pads 24 through 47 are arranged in the lower side (B area). A1 through A15 and A17 through A20 are disposed at the edge (A area) of one short side as address electrodes. Data electrodes DQ0 through DQ15 are disposed in the B area (pads 24 through 47) close to the other short side. The address electrodes increases in number as compared with the data electrodes in the A area, whereas the data electrodes increases in number as compared with the address electrodes in the B area. The A area of the SDRAM chip 6 is located on the A area side of the flash memory chip 5, and the B area of the SDRAM chip 6 is located on the B area side of the flash memory chip 5.

Figure 14A:
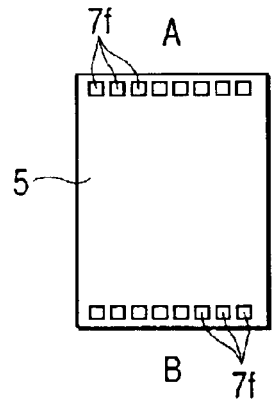
FIGS. 14a, 14b are typical diagram illustrating function distributions of the electrodes employed in the dynamic random access memory chip and the flash memory chip.
Figure 14B:
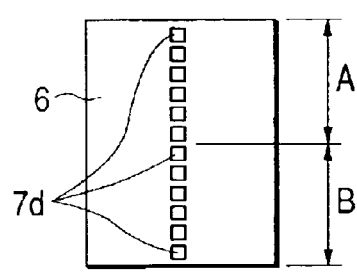

These relationships are shown in FIGS. 14(a) and 14(b). Forming the areas in parts and disposing the pins makes it possible to facilitate the routing of the electrodes 7p of the wiring board 2 and reduce wiring lengths. A clock terminal is disposed at an address H14 in FIG. 7. Clock electrodes connected with the wires are disposed on the main surface of the wiring board between the two dynamic random access memory chips arranged adjacent to each other while they will be described later. Such clock electrodes, and clock electrodes for the two dynamic random access memory chips are connected to one another by wires. The clock electrodes on the main surface of the wiring board are disposed singly or two in juxtaposition. Structurally, the other end of each of the wires whose one ends are connected to the clock electrodes of the two dynamic random access memory chips, is connected to the single clock electrode, or two wires are separately connected to the clock electrodes disposed two in juxtaposition.

Since the wiring lengths for clock signals used for the two dynamic random access memory chips are perfectly equal owing to such an arrangement of the clock terminals and clock electrodes, the amounts of delays in signal due to wiring resistance are also equal, and the two dynamic random access memory chips can be operated simultaneously. The clock electrodes on the main surface of the wiring board are respectively disposed at equal distances and the shortest distances as viewed from the clock electrodes of the two dynamic random access memory chips. Even in the bump electrodes on the back surface of the wiring board, the clock terminals are disposed on H columns each corresponding to the center of the wiring board, and these are connected at the shortest distances. Therefore, the wiring resistance of each clock signal line reaches a minimum and hence a high-speed operation of each dynamic random access memory chip is enabled.

The respective names of the bump electrodes 4 on the back surface of the system memory module 1 are shown in FIG. 7, and the state of an arrangement of these bump electrodes 4 is shown in FIG. 8 in the form of tabular representation. Terminal names of address electrodes and data electrodes, which are marked with SD at their heads, are those related to the SDRAM chip 6. Ones marked with F at their heads are external electrode terminals of the flash memory chip 5. N.C. are non-contact pins and electrodes non-provided for use.

Since the power supplies are isolated between the SDRAM chip 6 and the flash memory chip 5 as is understood even from the respective drawings in the present embodiment 1, the generation of noise can be suppressed.

Since the address/data pins of the SDRAM chip 6 and the flash memory chip 5 are disposed close to one another as is understood even from the respective drawings in the present embodiment 1, the routing of wirings for a printed circuit board with the system memory module 1 packaged thereon becomes easy.

The manufacture of the system memory module (semiconductor device) 1 according to the present embodiment 1 will next be described with reference to FIGS. 15 through 28.

Figure 15:
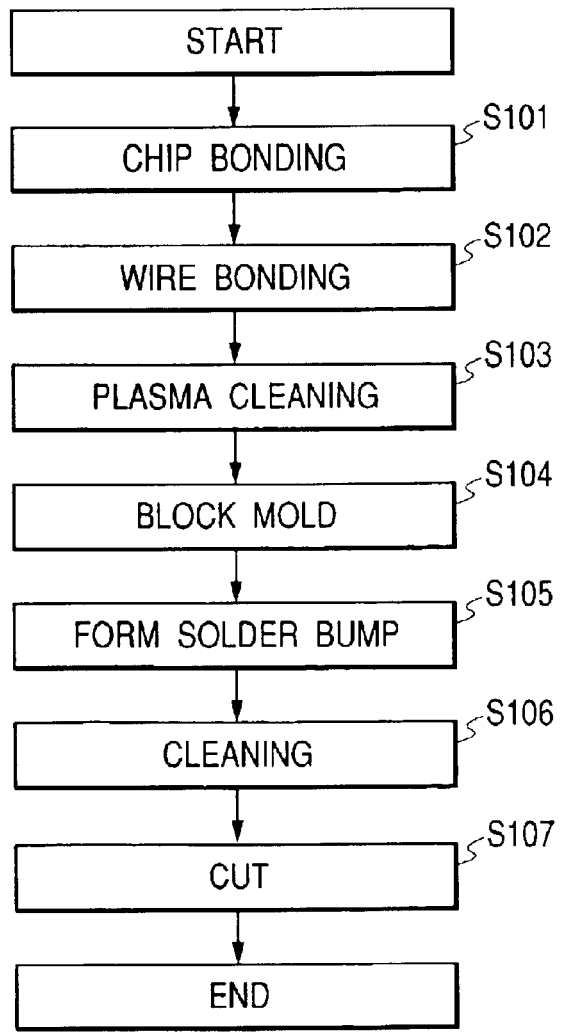
FIG. 15 is a flowchart showing the method of manufacturing the semiconductor device according to the present embodiment 1.

As shown in a flowchart of FIG. 15, the system memory module 1 is manufactured through respective process steps of chip bonding (S101), wire bonding (S102), plasma cleaning (S103), block mold (S104), solder bump formation (protruded-electrode formation: S105), cleaning (S106) and cutting (S107) after the start of work.

Figure 16:
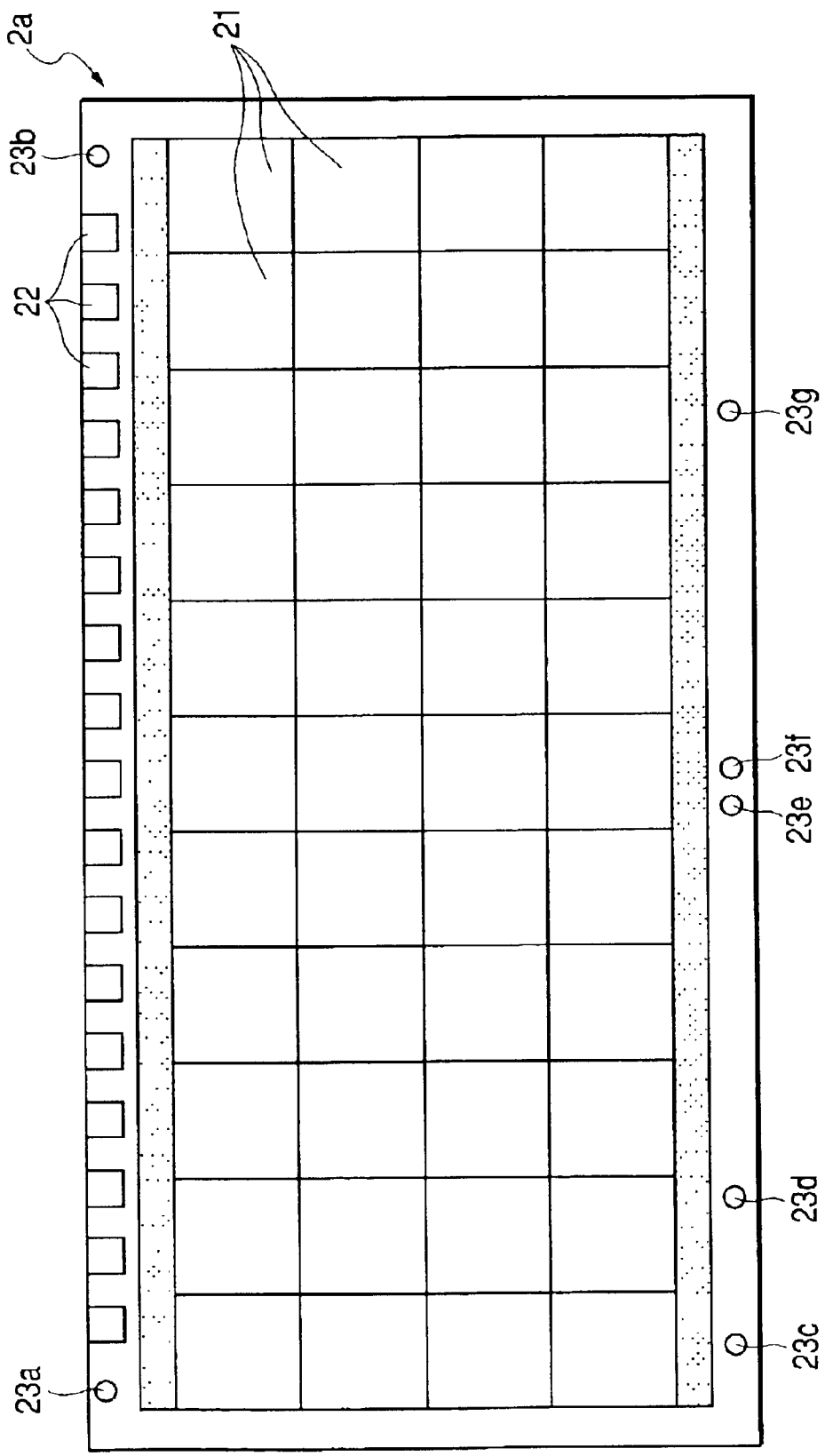
FIG. 16 is a plan view of a wiring board (substrate) employed in the method of manufacturing the semiconductor device according to the present embodiment 1.
Figure 17:
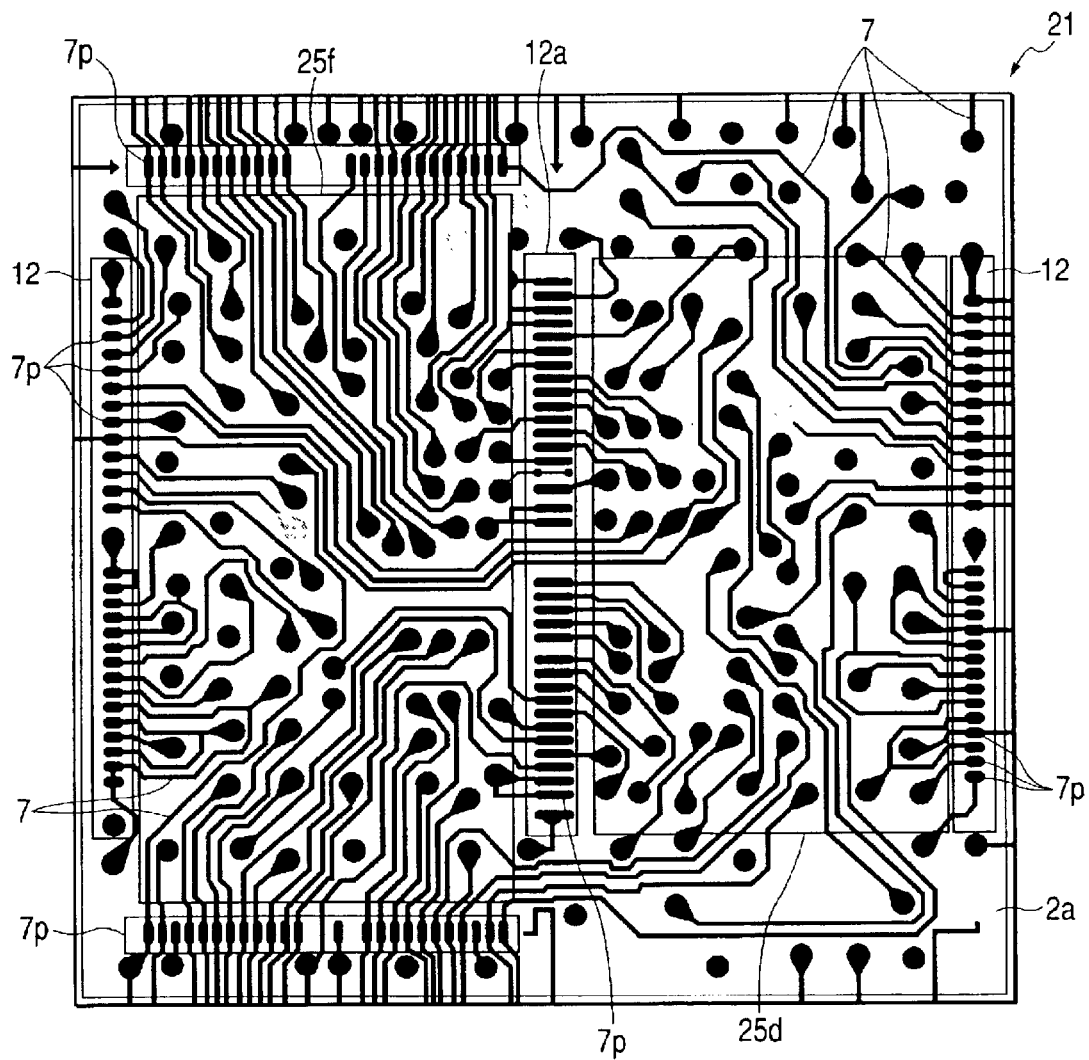
FIG. 17 is a typical plan view showing wiring patterns of a first layer on the main surface side of a product forming area of the substrate.
Figure 18:
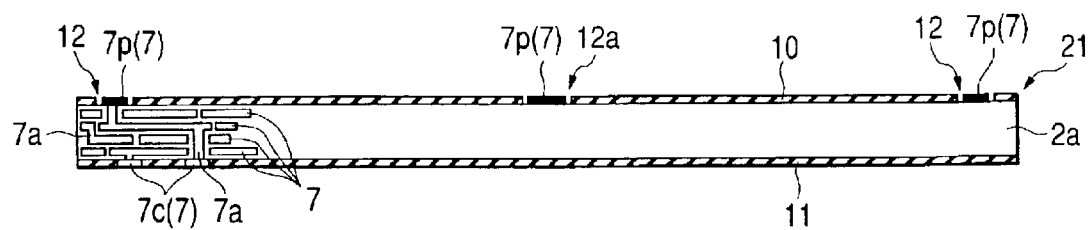
FIG. 18 is a typical sectional view of the product forming area.

FIGS. 16 through 18 are respectively diagrams related to a wiring board 2a used in the manufacture of the system memory module 1 according to the present embodiment 1, wherein FIG. 16 is a plan view of the wiring board 2a. FIGS. 17 through 21 are respectively diagrams related to a product forming area in the wiring board 2a.

As shown in FIG. 16, the wiring board 2a is shaped in the form of a rectangle, for example. A plurality of product forming areas 21 are disposed in matrix form at predetermined intervals on a main surface of the wiring board 2a, which is used as a surface with semiconductor chips mounted thereon. For example, the product forming areas 21 are arranged eleven along the longitudinal direction of the wiring board 2a, and the product forming areas 21 are arranged four along its transverse direction. Thus, they are disposed with eleven columns and four rows.

In FIG. 16, rectangular portions 22 shown on an upper long side of the wiring board 2a at predetermined intervals respectively indicate gate positions where a resin is injected by a transfer molding device upon formation of a package 3. Disposing the gate positions thickly makes it possible to prevent occurrence of non-charged portions of the encapsulating resin upon block encapsulation. Guide holes 23a through 23g defined as round shapes or elongated holes are provided on both sides, i.e., longitudinal edges of the wiring board 2a and used upon manufacture, conveying and positioning of the system memory module 1.

Figure 19:
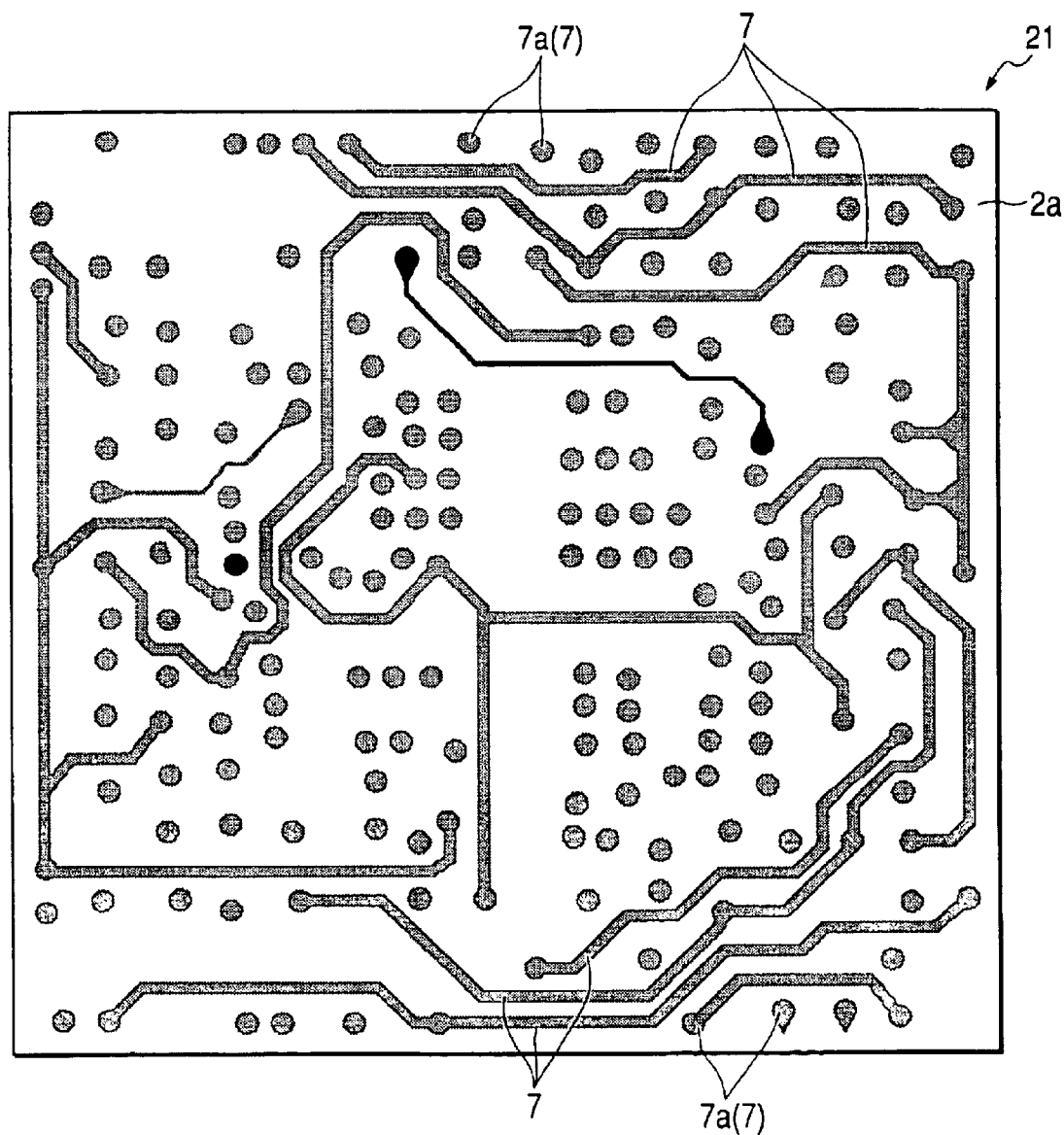
FIG. 19 is a perspective diagram showing wiring patterns of a second layer in the product forming area of the substrate.
Figure 20:
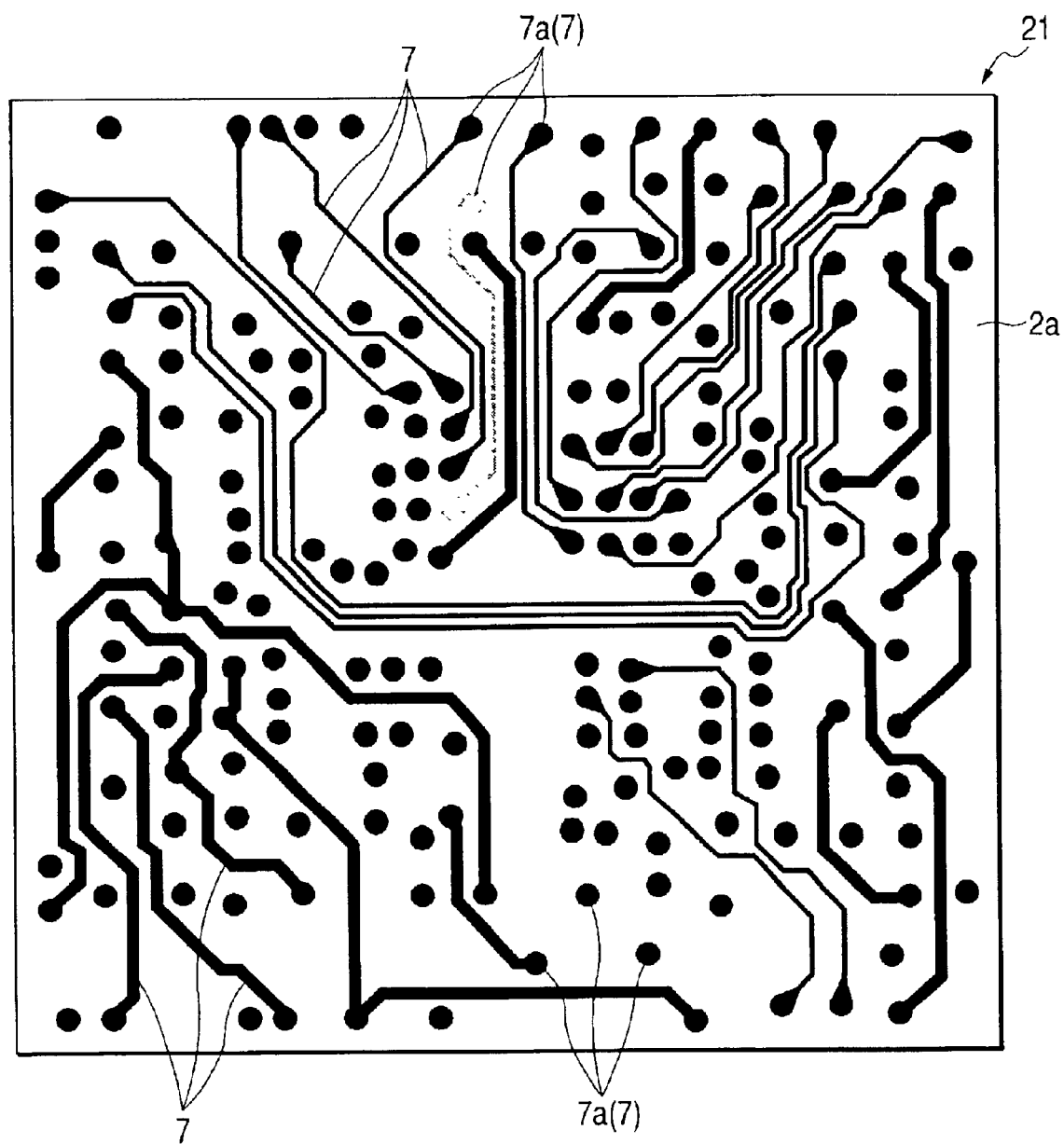
FIG. 20 is a perspective diagram illustrating wiring patterns of a third layer in the product forming area of the substrate.
Figure 21:
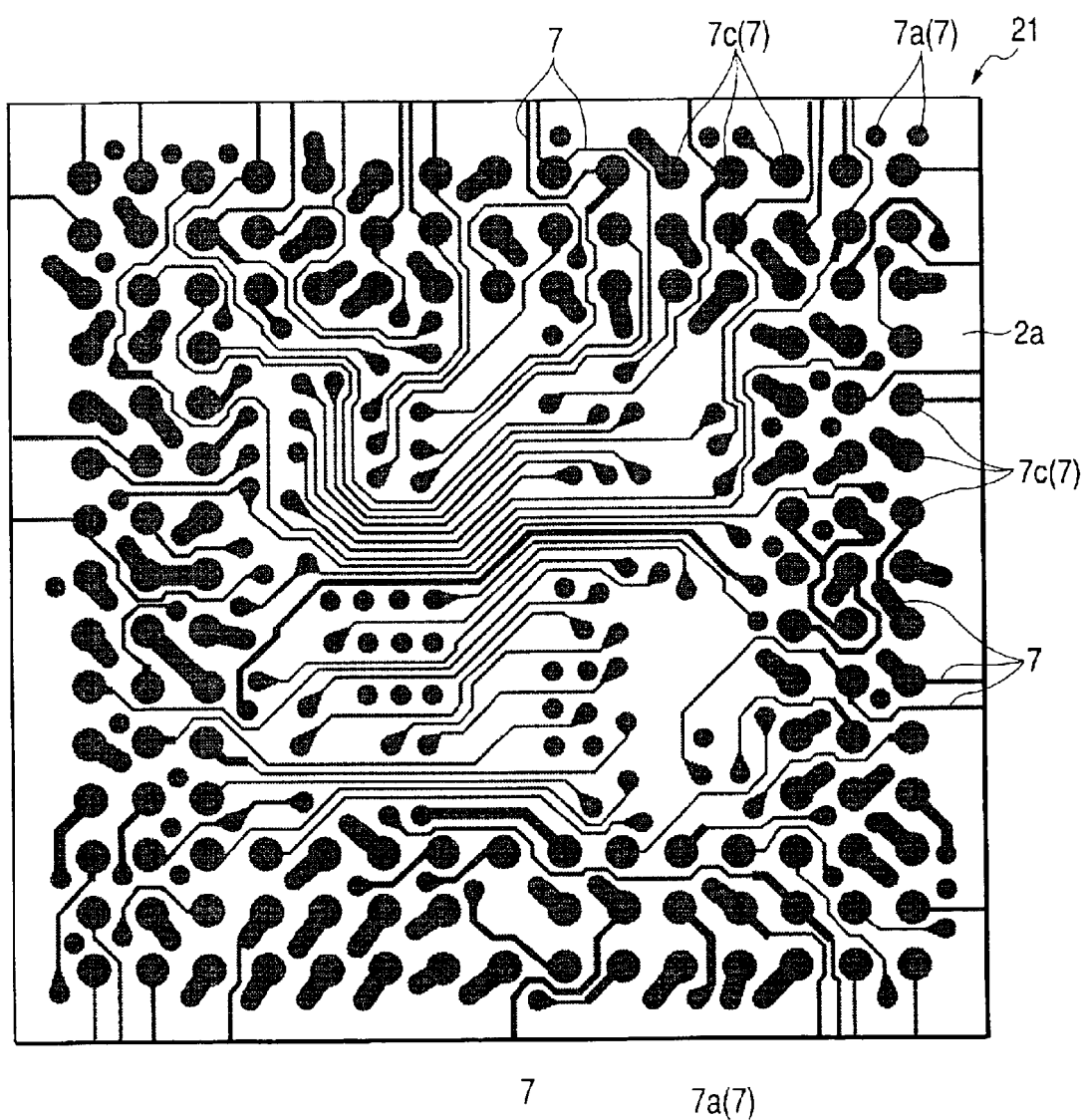
FIG. 21 is a perspective diagram depicting wiring patterns on the back surface (fourth layer) of the product forming area of the substrate.

While the product forming areas 21 are represented in blank quadrangular areas (similar to squares) in FIG. 16, their structures or the like take such configurations as shown in FIGS. 17 through 21. FIG. 17 is a plan view showing, in see-through form, wiring patterns (wring patterns in a first layer) on the main surface side of a product forming area 21, FIG. 18 is a typical sectional view of a product forming portion, FIG. 19 is a perspective diagram showing wiring patterns in a second layer, FIG. 20 is a perspective diagram showing wiring patterns in a third layer, and FIG. 21 is a perspective diagram showing wiring patterns in a fourth layer (back surface of the substrate), respectively.

Since the obverse and reverse sides (main surface and back surface) of the wiring board 2a are covered with insulating films (solder resists) 10 and 11 as shown in FIG. 18, the insulating films 10 and 11 are omitted in FIG. 17.

As shown in FIG. 18, the wiring board 2a comprises a multilayer structure wherein wirings 7 each shaped in a predetermined pattern are provided on the main surface and back surface of a wiring board 2 and in one or more middle layers thereof, and upper and lower wirings 7 are electrically connected to one another by conductors 7a (wirings) charged into through holes. The wring board 2a takes a BT substrate configuration, for example. The wirings 7 constitute electrodes 7p for connecting wires 9 on the main surface of the wiring board 2, and electrodes 7c used as bases for fixing bump electrodes 4 are provided on the back surface thereof. The wirings 7 are connected to their corresponding wirings 7 of each adjacent product forming area 21.

As shown in FIG. 17, each product forming area 21 of the wiring board 2a is provided with two chip mounting areas 25f and 25d in parallel. The chip mounting area 25f is an area to which a flash memory chip 5 is fixed, whereas the chip mounting area 25d is an area to which a SDRAM chip 6 is fixed. The flash memory chip 5 and the SDRAM chip 6 both defined as rectangular respectively have long sides that extend along the short sides of the wiring board 2. Open grooves 12 are respectively provided on both sides of long sides of these chip mounting areas 25f and 25d, and open grooves 12 are provided even on the sides of short sides of the chip mounting area 25f. Each of the open grooves 12 has a structure wherein the insulating film is removed with a constant width, and the electrodes 7p corresponding to some of the wirings 7 are exposed within the open grooves 12 (see FIG. 16).

The open groove 12a lying between both the chip mounting areas 25f and 25d results in a single wide open groove 12a in such a manner that the wire bonding electrodes 7p connected between the semiconductor chips mounted on the right and left two chip mounting areas 25f and 25d are located therewithin together. Namely, second bonding points for wire bonding are arranged within the open groove 12a in two rows along its extending direction. As to such second bonding points, both end portions of the single long electrode 7p are defined as the second bonding points.

Small circles shown in FIG. 17 and FIGS. 19 through 21 are through holes and indicate portions filled with the conductors 7a. They are portions for electrically connecting upper and lower wirings with an insulating layer interposed therebetween. Large circled portions shown in FIG. 21 indicate electrodes 7c used as bases for forming the bump electrodes 4 on the back surface of the wiring board 2a. These electrodes 7c are arranged by three rows along the respective sides of the product forming area 21 and provided fifteen at its outermost peripheries, whereby the 144 electrodes are arranged in total. Their patterns are represented as such patterns as shown in FIGS. 4 and 7.

In the present embodiment 1, the BT substrate is used in which the wirings are configured as the four layers. Wiring patterns for the respective layers are represented as shown in FIG. 17 and FIGS. 19 through 21. Namely, FIG. 17 shows a first wiring pattern which is of the main surface of the wiring board 2a, FIG. 19 shows a second wiring pattern, FIG. 20 is a third wiring pattern, and FIG. 21 is a fourth wiring pattern corresponding to the back surface of the wiring board 2a, respectively. While the insulating films 10 and 11 are provided on the main surface and back surface of the wiring board 2a, they are omitted from these drawings. The electrodes 7p connected with the wires are exposed on the main surface of the wiring board 2a, and the electrodes 7c used as the bases for forming the bump electrodes 4 are exposed on the back surface thereof. The wirings for the respective layers are electrically connected to one another by the conductors 7a referred to above.

Figure 22:
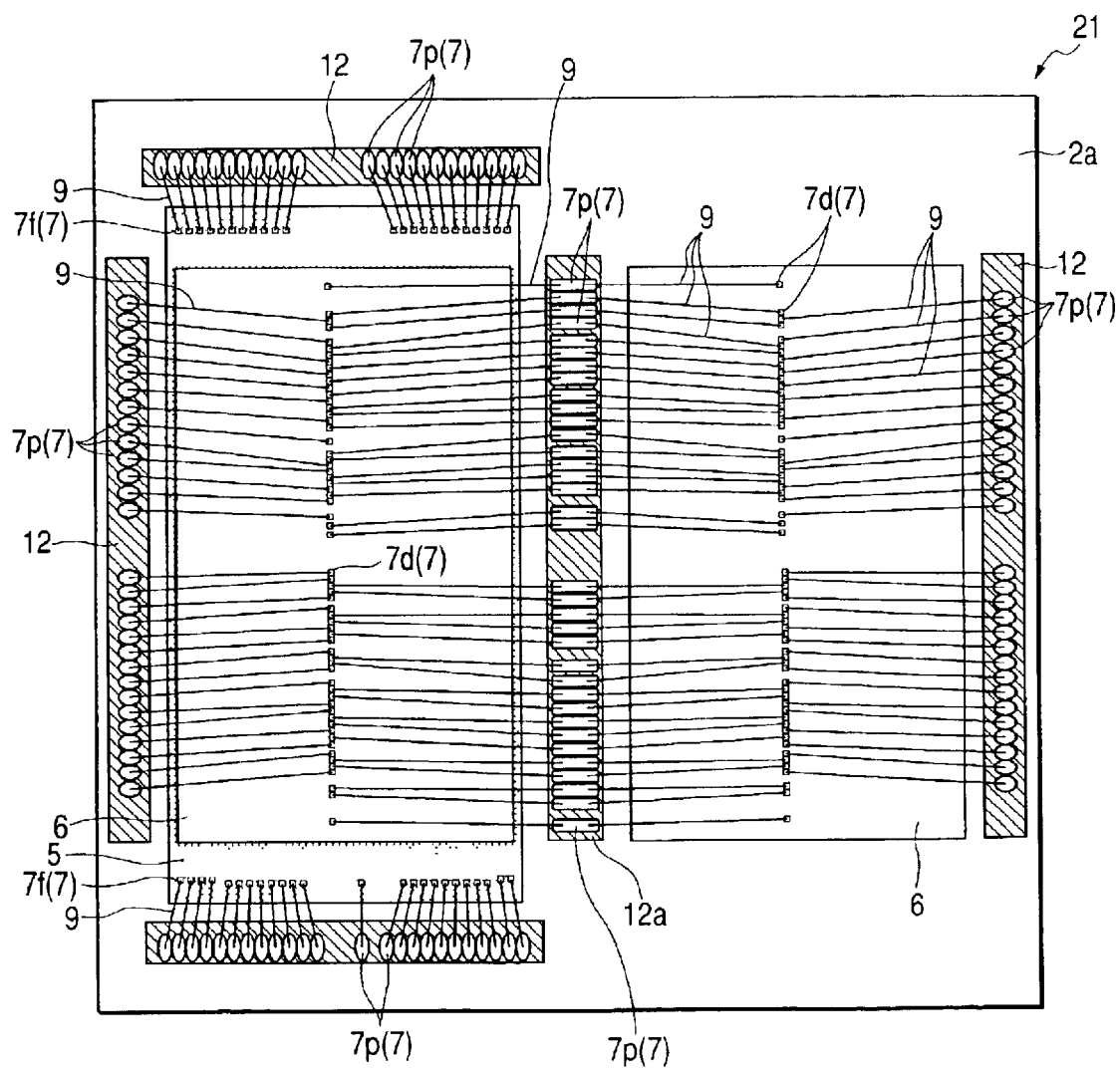
FIG. 22 is a typical plan view of the product forming area, showing a state in which the semiconductor chips are mounted, and the electrodes of the semiconductor chips and the electrodes of the substrate are connected to one another by wires under the method of manufacturing the semiconductor device according to the present embodiment 1.
Figure 23:
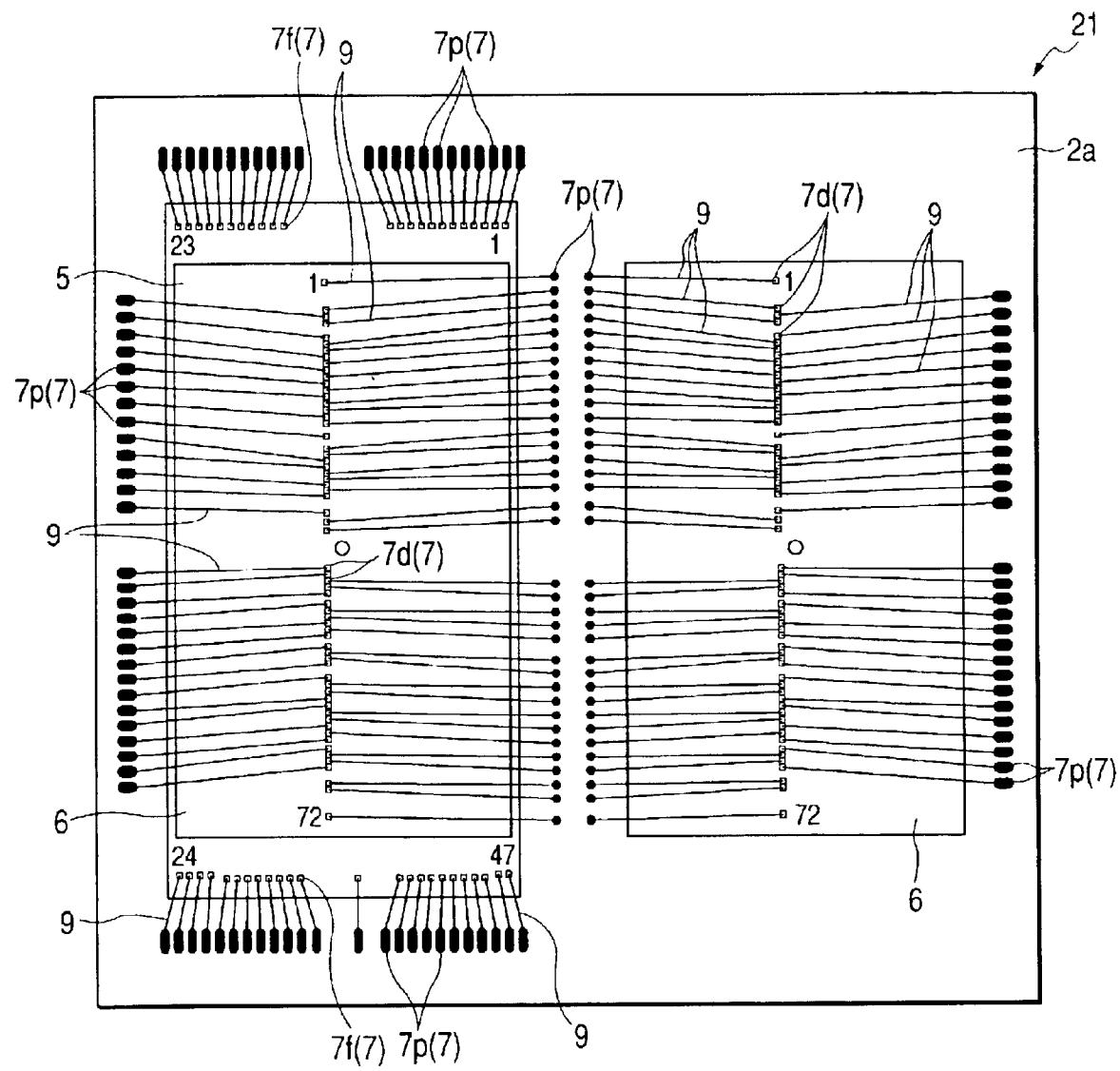
FIG. 23 is a typical diagram of the product forming area in which chip bonding and wire bonding have been completed.

Next, the semiconductor chips are connected to the respective chip mounting areas 25f and 25d with respect to such a wiring board 2a with adhesives interposed therebetween (chip bonding: S101). The respective electrodes of the semiconductor chips and the respective electrodes of the wiring board 2a are connected to one another by their corresponding conductive wires (S102). FIG. 22 is a plan view of the product forming area 21 to which the flash memory chip 5 and the SDRAM chips 6 are fixed as the semiconductor chips and wherein wire boding has been completed. FIG. 23 is a typical diagram of a product forming portion in which chip bonding and wire bonding have been completed, and is a diagram in which open grooves 12 are omitted and wire connecting points are defined as first and second bonding points.

As shown in FIG. 22, the flash memory chip 5 and the SDRAM chip 6 are respectively fixed to the chip mounting areas 25f and 25d (see FIG. 17) on the main surface of the wiring board 2 by means of unillustrated adhesives (e.g., epoxy resin paste). Further, the SDRAM chip 6 is fixed onto the flash memory chip 5 by means of an unillustrated adhesive. The two SDRAM chips 6 are identical in type to each other, which are, for example, semiconductor chips each having a 64-Mbit synchronous dynamic random access memory built therein. While any of the flash memory chip 5 and SDRAM chips 6 is shaped in a rectangular form, the SDRAM chips 6 are shorter in long side than the flash memory chip 5. When the SDRAM chip 6 is fixed to the flash memory chip 5 in such a manner that the center of the flash memory chip 5 is made coincident with the center of the SDRAM chip 6, electrodes 7f provided at both short sides of the flash memory chip 5 are exposed without being covered with the SDRAM chip 6. Electrodes 7d on the upper surface of each SDRAM chip 6 are also exposed.

Thus, the exposed electrodes 7f and 7d and the electrodes 7p of the wiring board 2a are wire-bonded by a commonly-used wire bonding device. Since the electrodes 7p exposed at the bottom of the open groove 12a between the right and left SDRAM chips 6 are slender, the wires 9 connected to the right and left SDRAM chips 6 are connected to their corresponding both end portions (second bonding points) thereof.

Although not illustrated in the drawing, plasma cleaning is next effected over the whole area of the main surface of the wiring board 2a upon post-step encapsulation (resin-based mold) to improve or increase adhesion between a block encapsulater and the surface on the main surface side of the wiring board 2a (S103). Thus, the surface starting with the insulating film 10 on the main surface side of the wiring board 2a, the surfaces of the semiconductor chips, wires 9, etc. are cleaned.

Figure 24:
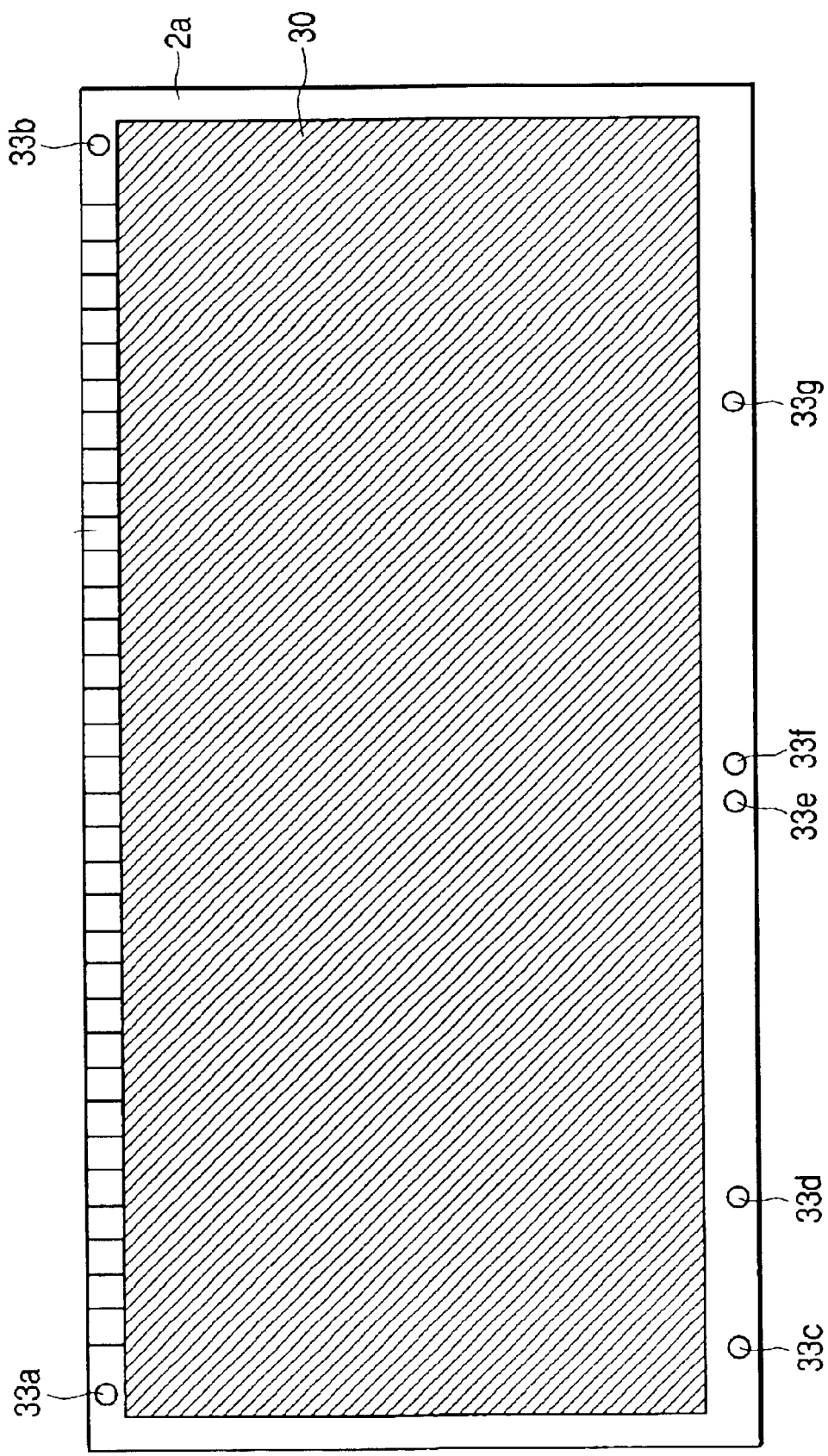
FIG. 24 is a plan view of a substrate formed with a block encapsulater on a main surface by block molding in the method of manufacturing the semiconductor device according to the present embodiment 1.
Figure 25:
FIG. 25 is a front view of the block-molded substrate.
Figure 26:
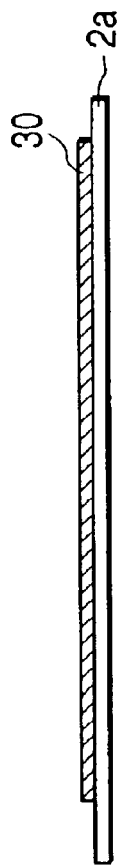
FIG. 26 is a side view of the block-molded substrate.

Next, block encapsulation (block molding) is performed by the transfer molding device to thereby form a single block encapsulater 30 on the main surface side of the wiring board 2a (S104). As shown in FIGS. 24 through 26, the block encapsulater 30 is formed integrally with the wiring board 2a except for peripheral edges out of the product forming area 21 of the wiring board 2a. Namely, the product forming areas 21 disposed with 11 columns and 4 rows are perfectly covered with the block encapsulater 30. The block encapsulater 30 has such a thickness as to perfectly cover the semiconductor chips and the wires and reaches a predetermined thickness. The block encapsulater 30 is formed of an insulating epoxy resin. In the present embodiment 1, it is uniformly charged into the whole area of a cavity (mold space) of a molding die by thickly disposing the gate positions.

Figure 27:
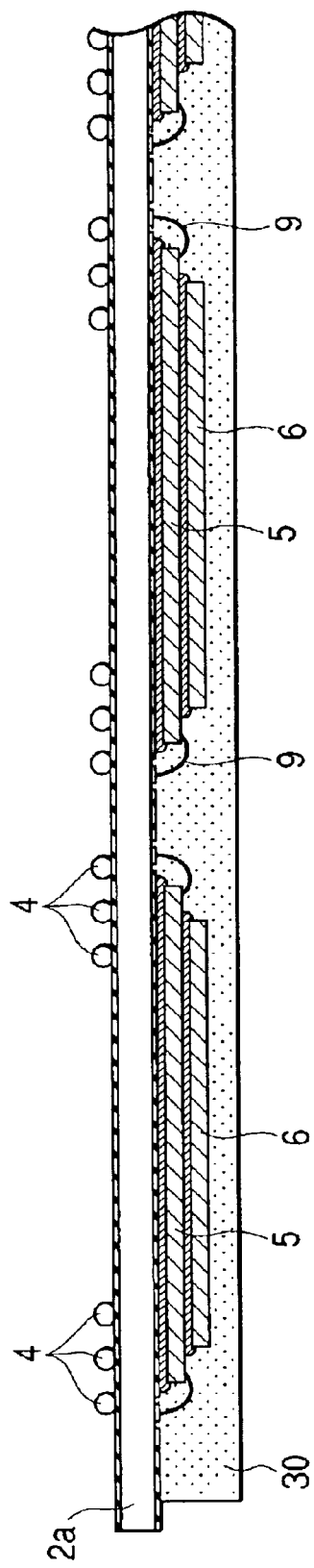
FIG. 27 is a cross-sectional view showing the substrate formed with solder bump electrodes by the method of manufacturing the semiconductor device according to the present embodiment 1.

Next, as shown in FIG. 27, protruded electrodes 4 are formed on the surfaces of the electrodes 7c (see FIG. 18) disposed on the back surface of the wiring board 2a, by a ball supplying method, for example. For example, solder balls are supplied to form solder bump electrodes (S105).

Next, the wiring board 2a formed with the block encapsulater 30 is cleaned (S106).

Figure 28:
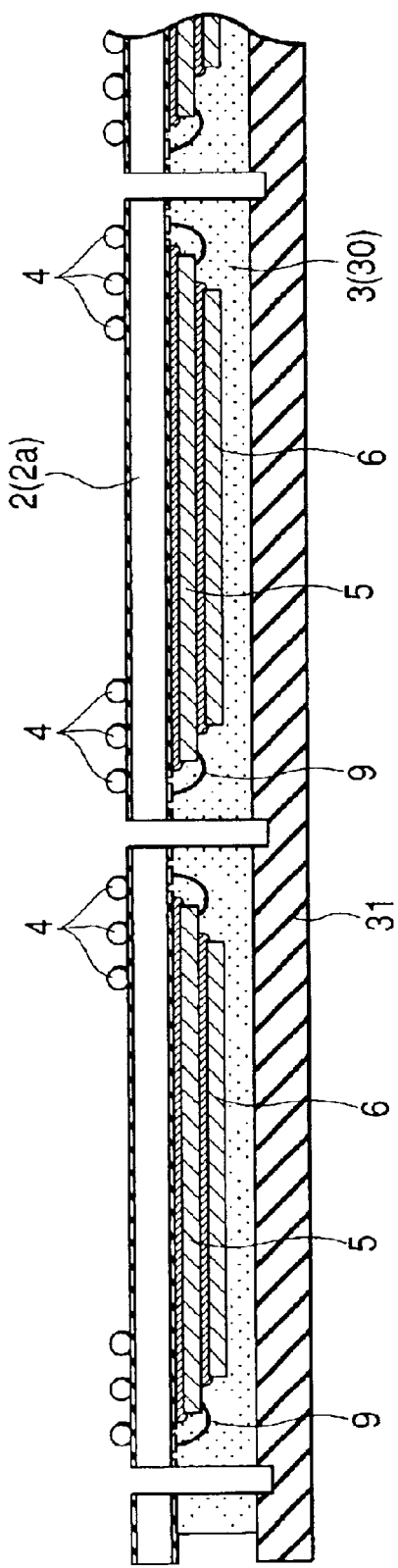
FIG. 28 is a typical cross-sectional view showing a state in which a substrate having a block encapsulater or package attached to a dicing sheet is divided together with the block encapsulater in the method of manufacturing the semiconductor device according to the present embodiment 1.

Next, as shown in FIG. 28, the wiring board 2a is bonded and fixed to a dicing sheet 31 in a state in which the block encapsulater 30 formed by the block molding method is placed face to face with the dicing sheet 31. Thereafter, the block encapsulater 30 and the wiring board 2a are cut and divided every product forming areas 21 by an unillustrated dicing device (S107). Owing to such division, the wiring board 2a results in wiring boards 2, and the block encapsulater 30 is brought to encapsulaters (packages) 3. Next, the dicing sheet 31 and the block encapsulaters 30 are separated from one another so that such a system memory module (semiconductor device) 1 as shown in FIGS. 1 through 4 can be fabricated in large numbers. The side faces, i.e., peripheral surface of the system memory module 1 results in surfaces cut by dicing. The surfaces result in surfaces substantially normal to the main surface of each wiring board 2.

Figure 29:
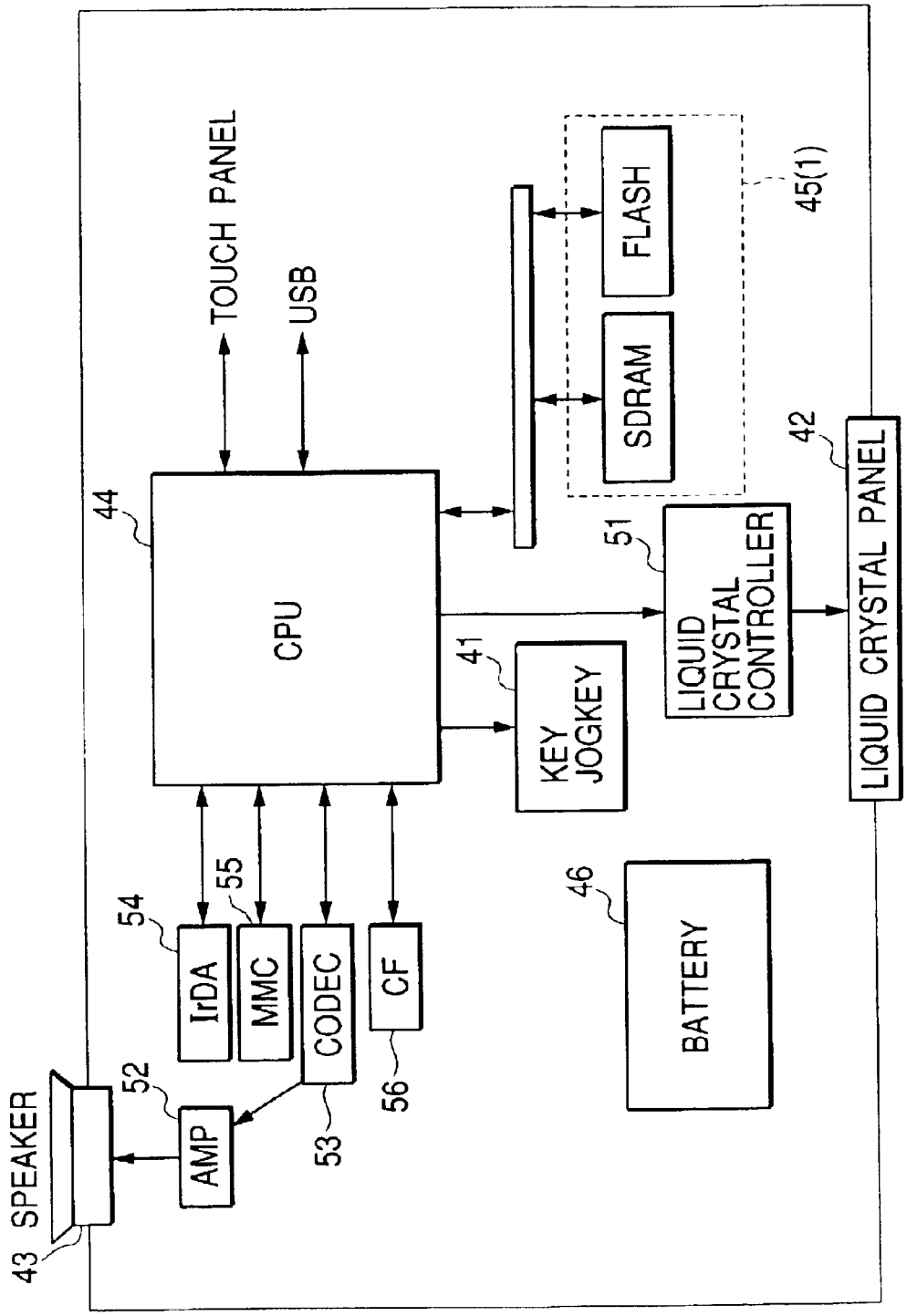
FIG. 29 is a block diagram showing a functional configuration of a personal digital assistant (PDA) built in the system memory module according to the present embodiment 1.

The system memory module 1 according to the present embodiment 1 is built as a memory for a personal digital assistant (PDA), for example. FIG. 29 is a block diagram showing a functional configuration of a personal digital assistant (PDA) with the system memory module 1 according to the present embodiment 1 built therein. The PDA has, in appearance, a key (JogKey) 41 used as input means, a liquid crystal display panel 42 used as a display device, and a speaker 43 used as a voice output device. The PDA is provided thereinside with a CPU 44, an internal memory 45, a battery 46, etc. mounted on an unillustrated mounting board. The system memory module 1 according to the present embodiment 1 is used as the internal memory 45.

The key (JogKey) 41 is connected to the CPU 44 to transmit key-operated information to the CPU 44. The liquid crystal display panel 42 is connected to the CPU 44 via a liquid crystal controller 51 to display predetermined information by means of the CPU 44. The liquid crystal display panel 42 comprises a touch panel, and touch information is transmitted to the CPU 44. The CPU 44 is connectable to a personal computer or the like by a USB interface.

The speaker 43 is connected to the CPU 44 via an amplifier (AMP) 52 and a coder decoder (CODE) 53. Further, an IrDA (Infrared Data Association) 54, an MMC (Multi Media Card) 55, and a CF (memory: compact flash (registered trademark)) 56 are connected to the CPU 44. The IrDA 54 serves as an interface for infrared data communications, the MMC 55 serves as an external memory, and the CF 56 serves as an external memory in a similar to the MMC 55.

The system memory module 1 according to the present embodiment 1 adopts an address-bus isolation configuration to make it connectable to all the CPUs and improve general versatility.

Namely, a SDRAM adopts a multiplex system in which the input of each address is specific, whereas a flash memory is capable of performing linear input and directly connectable to each address of a CPU. Thus, since they are different in address input method, there is a possibility that the SDRAM and the flash memory will be different in address connecting destination depending on CPUs to be connected. If address buses are connected to such various CPUs within a module, then connectable CPUs are limited. However, if the address buses are kept in isolation, then they can be connected to all the CPUs, thus improving general versatility.

Figure 30:
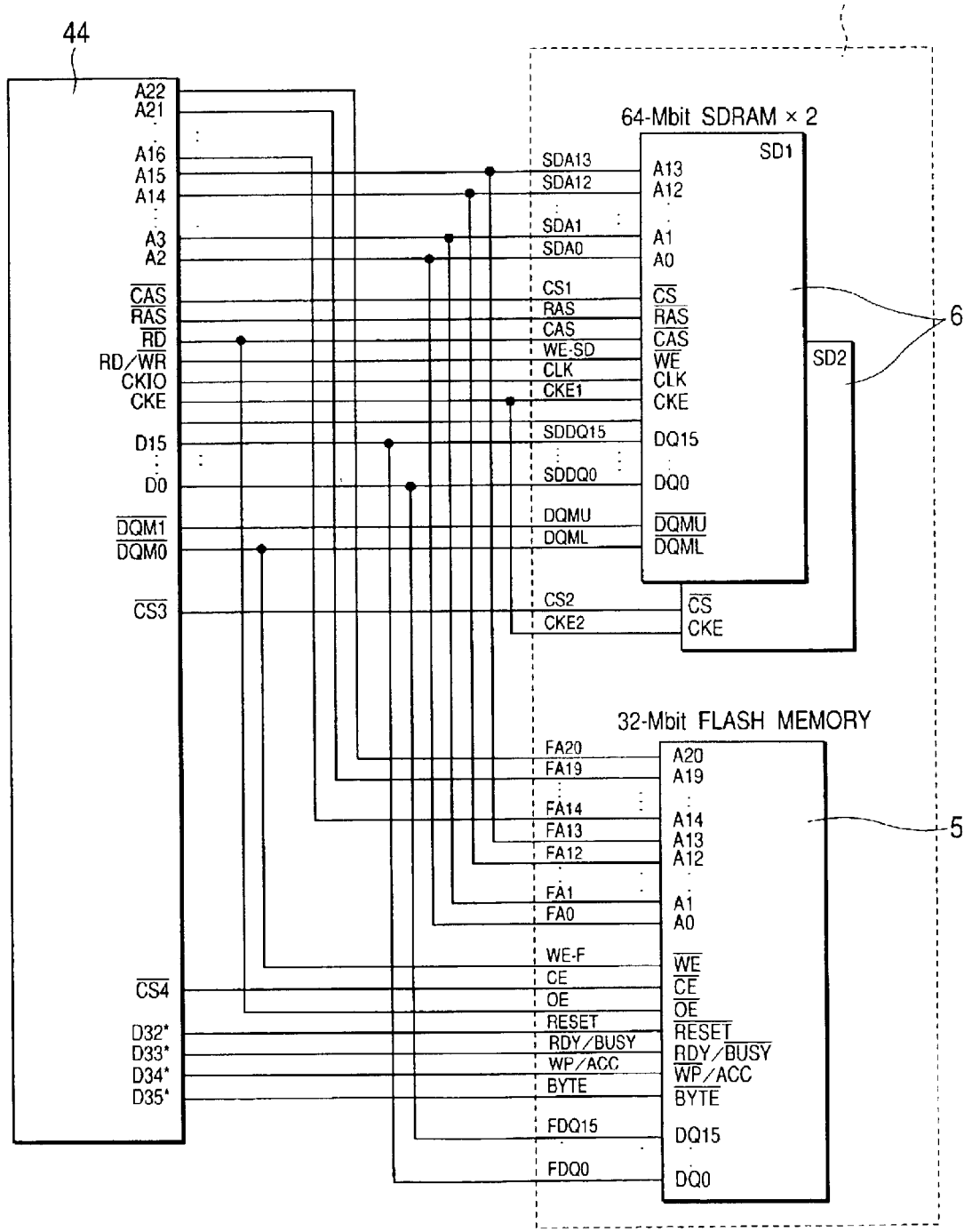
FIG. 30 is a block diagram illustrating a state in which the system memory module according to the present embodiment 1 and a CPU are connected to each other.

FIG. 30 is a connection diagram at connection to the CPU 44. In this case, A0 through A13 (SDA0 through SDA13) of the SDRAM are connected to their corresponding A2 through A15 of the CPU 44. On the other hand, A0 through A20 (FA0 through FA20) of the flash memory are connected to their corresponding A2 through A22 of the CPU 44. This example is a connection in which a predetermined CPU is supposed. Thus, when a CPU to be connected is determined in advance, address buses may be connected inside a module. Consequently, the routing of wirings for a printed circuit board is made smooth and the number of pints may be less reduced.

In the system memory module 1 according to the present embodiment 1, data (I/O) buses are kept in isolation. Namely, when the SDRAM and the flash memory are connected within the module in the system memory module 1, they are connectable to a single CPU only. However, since the buses are separately provided, they can be connected to a plurality of CPUs (different in intended purpose).

Figure 31:
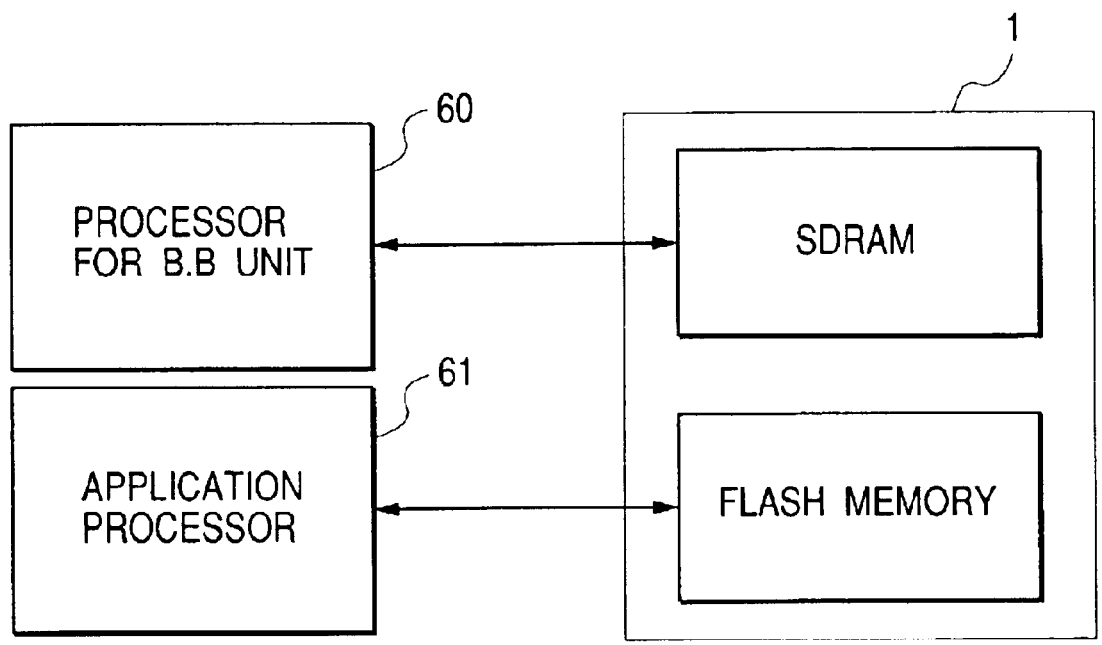
FIG. 31 is a block diagram showing a configuration in which data buses of an SDRAM and a flash memory are separated from each other within a module.

For example, FIG. 31 is an example in which data buses for an SDRAM and a flash memory are isolated from each other within a module. When a cellular telephone is provided with a base band processor 60 for connecting the SDRAM, and an application processor 61 for connecting the flash memory, an address bus and a data bus are kept in isolation, so that the SDRAM and flash memory are made connectable to their corresponding CPUs. The SDRAM and the flash memory may be separately operated in parallel.

However, when the CPU to be connected is one, the data buses may be connected inside the module. Owing to it, the routing of wrings for a printed circuit board is made smooth and the number of pints may be less reduced.

Figure 32:
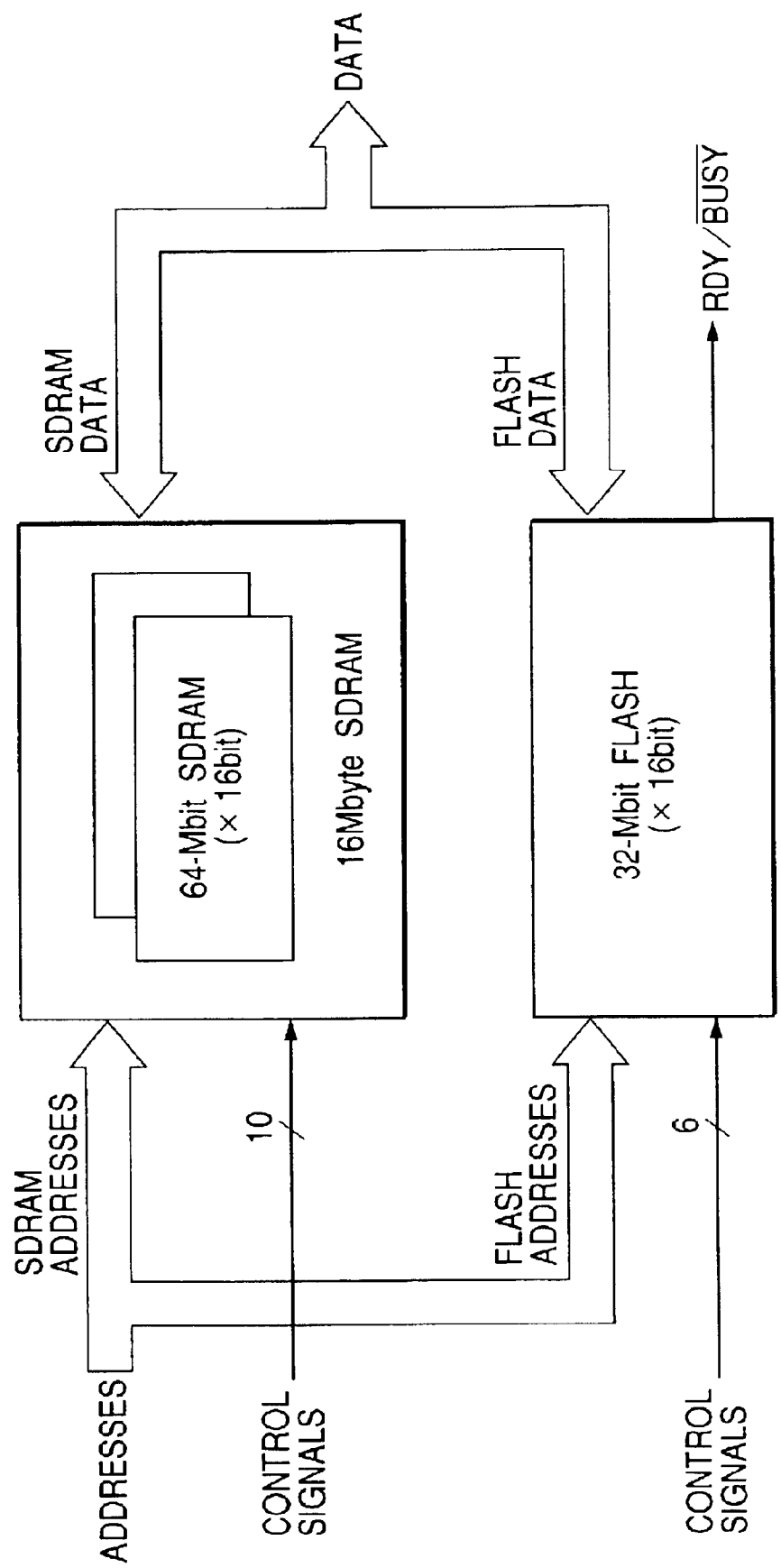
FIG. 32 is a block diagram showing a configuration common to address/data buses in an SDRAM and a flash memory.

A description will now be made of examples of combinations of isolation/sharing of address and data buses. FIG. 32 is a block diagram showing a configuration of sharing of the use of address/data buses between a SDRAM and a flash memory. In the present example, connecting destination CPUs are limited and connections to a plurality of CPUs are also disabled.

Figure 33:
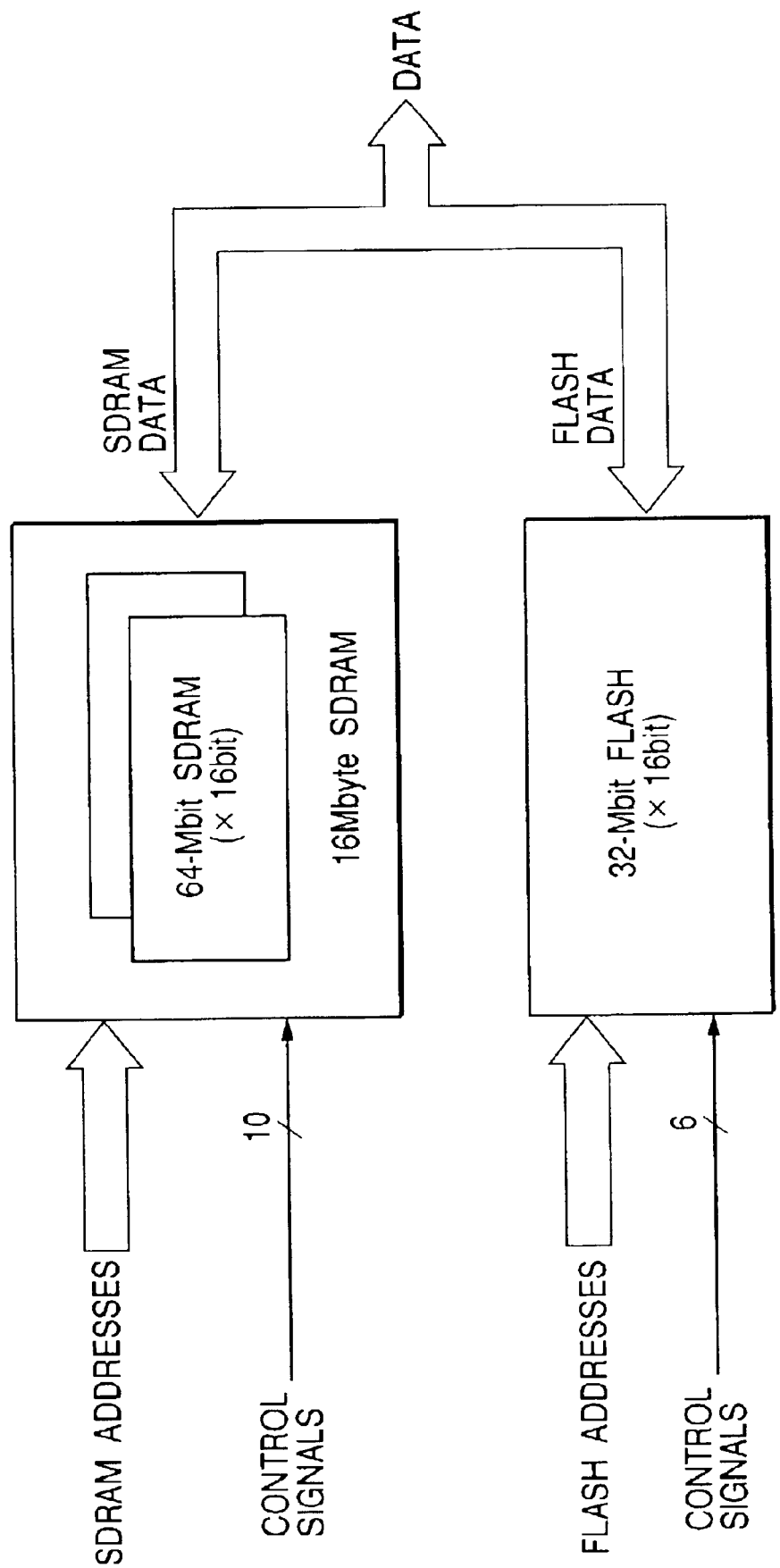
FIG. 33 is a block diagram illustrating a configuration in which address buses are separated from each other and a data bus is used in common in an SDRAM and a flash memory.

FIG. 33 is a block diagram showing a configuration illustrative of address-bus isolation and data-bus sharing between a SDRAM and a flash memory. While no limitation is imposed on connecting destination CPUs in the present example, they are unconnectable to a plurality of CPUs.

Figure 34:
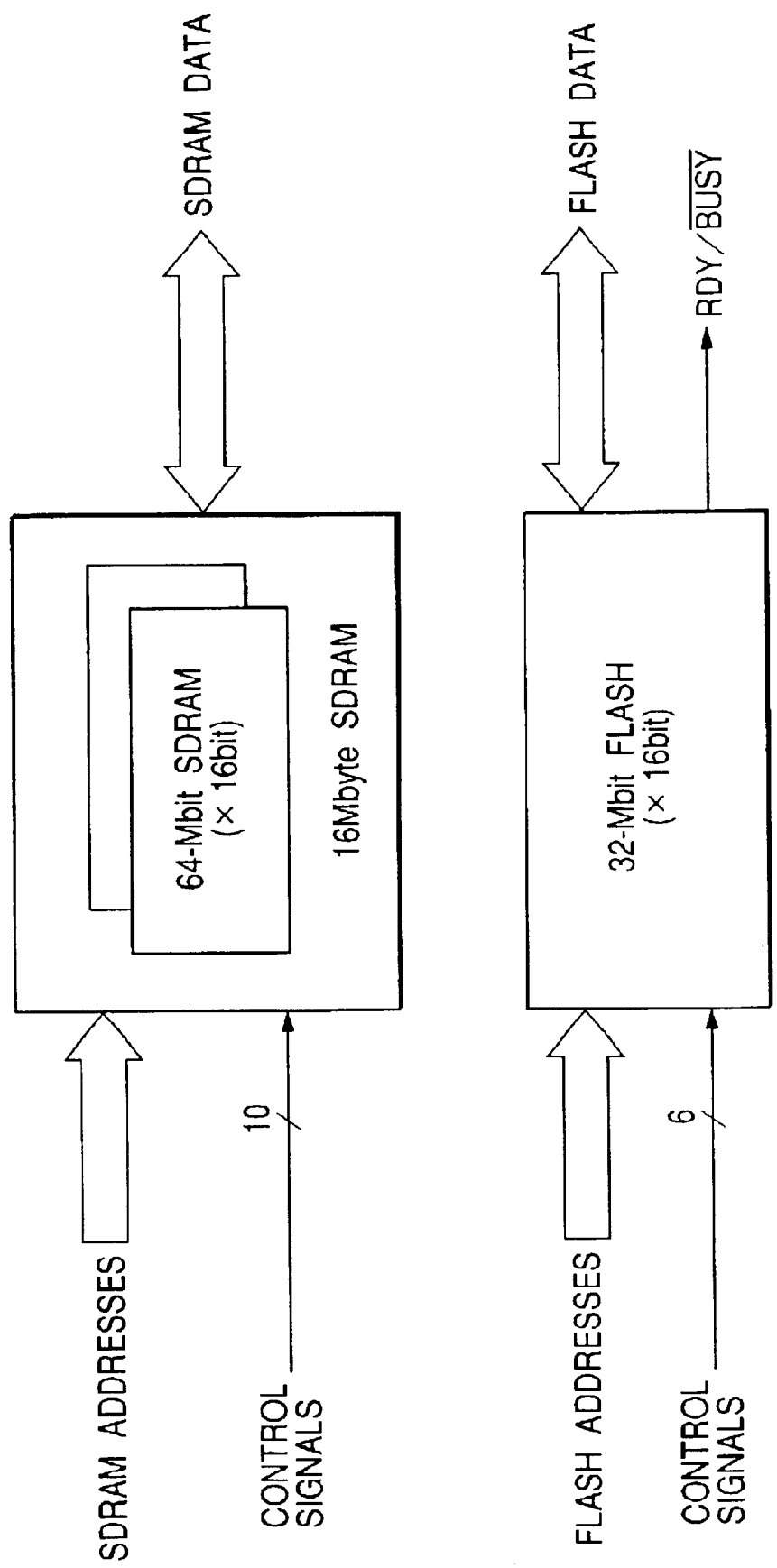
FIG. 34 is a block diagram showing a configuration in which address/data buses are separated from one another in an SDRAM and a flash memory.

FIG. 34 is a block diagram showing a configuration of address/data-bus separation between a SDRAM and a flash memory. In the present example, no limitation is imposed on connecting destination CPUs, and they are also connectable to a plurality of CPUs.

Figure 35:
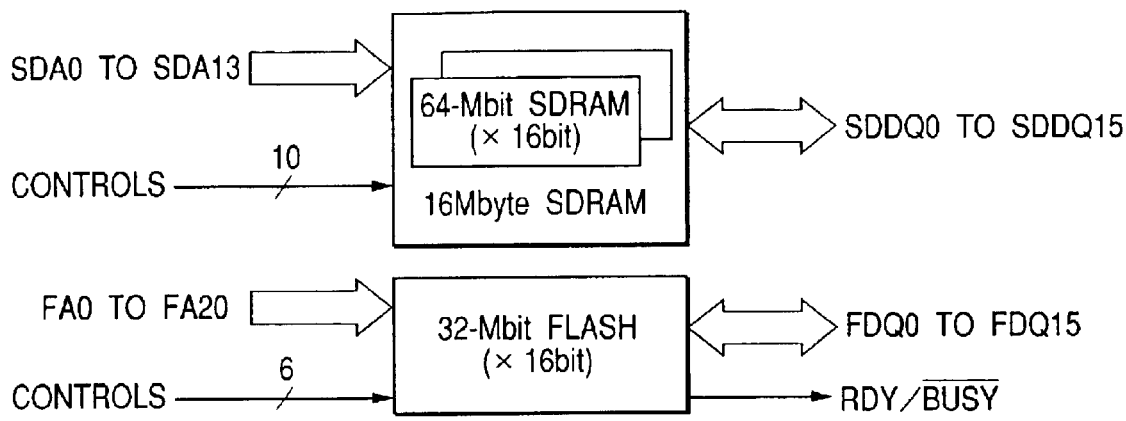
FIG. 35 is a block diagram illustrating modules of a 64 Mbit SDRAM and a 32 Mbit flash memory.

As shown in FIG. 35, an address/data-bus separate configuration is taken in the system memory module 1 according to the present embodiment 1. In the present embodiment 1, the address and data buses for the SDRAM and the flash memory are separately provided outside. Thus, the SDRAM and the flash memory can be easily tested respectively. Even when they are actually used, the SDRAM and the flash memory can be operated in parallel.

As another merit of separating the address buses from each other, the SDRAM and flash memory are connectable to CPUs having different bus widths (16 bit/32 bit), and general versatility is improved. Namely, since destinations for connection to memory addresses are different when the CPUs are different in bus width, the general versatility is improved.

Figure 36:
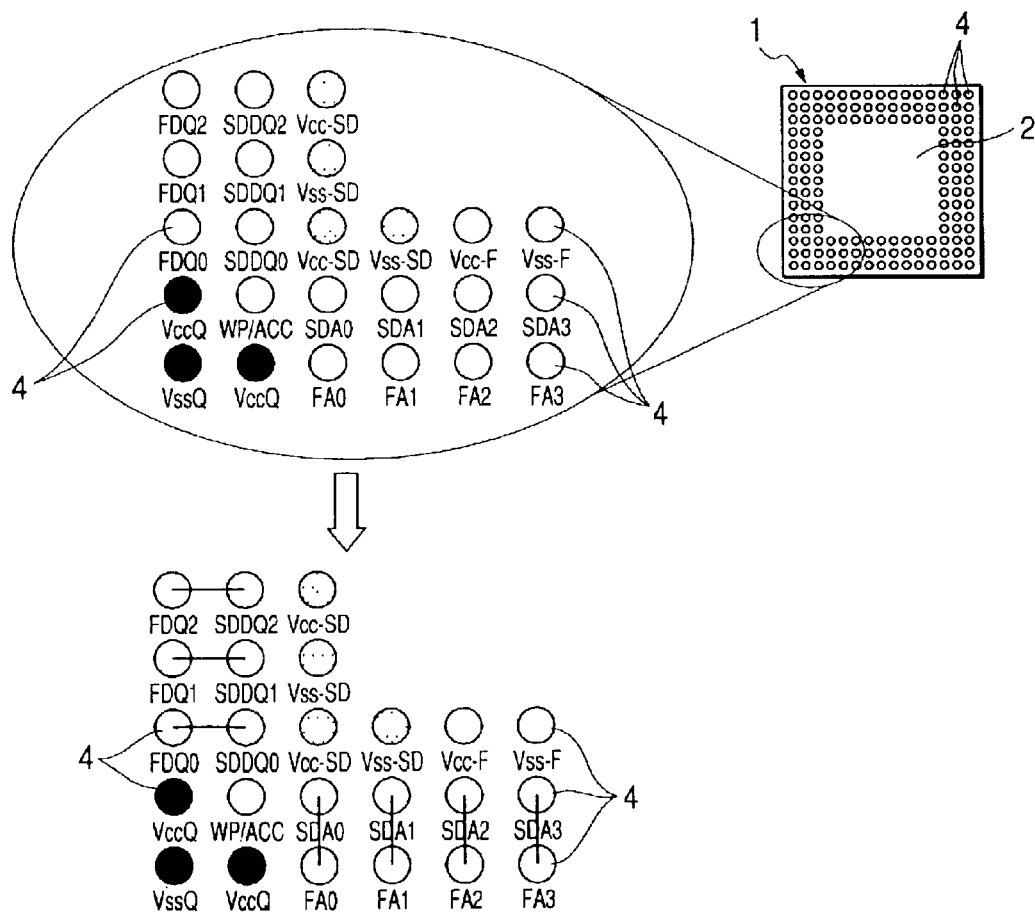
FIG. 36 is a typical diagram showing a method of changing a separate bus to a common bus in the system memory module according to the present embodiment 1.

In the present embodiment 1, the pin configuration (bump electrode arrangement) is adopted wherein common busing is taken into consideration. While the address and data buses for the SDRAM and the flash memory are respectively separately provided outside, they are laid out in consideration of bus sharing at this time. FIG. 36 is a typical diagram showing a method of changing a separate bus to a common bus in the system memory module according to the present embodiment 1. Since shareable pins (bump electrodes 4) are disposed adjacent to one another as shown in FIG. 36, the separate bus and the common bus can be used properly according to user requests. When it is desired to share them in a drawing shown below FIG. 36, the adjacent bump electrodes 4 are connected to one another as indicated by linear lines. Such connections are performed on the printed circuit board side. Owing to the adoption of such a method, the separate bus can be used even as the common bus although it is of the separate bus.

Further, power supplies are kept in isolation in the present embodiment 1. While the system memory module 1 is operated by a single power supply, power supplies for the SDRAM and flash memory, and ground are respectively provided outside in isolation. Namely, the power supplies and ground are respectively separately provided as in the case of a core power supply for the SDRAM, grounds (Vcc-SD, Vss-SD), an I/O power supply, ground (Vcc-Q, Vss-Q), a Flash power supply, and grounds (Vcc-F, Vss-F). According to such a configuration, since wiring distances become long as compared with wire-connections in an MCM, noise resistance properties can be improved. When semiconductor chips different in operating voltage are used, tests in units of semiconductor chips are enabled upon tests such as burn-in, etc. and the tests can be easily achieved.

According to the present embodiment 1, the following advantageous effects are brought about. (1) A BGA type system memory module adopting a block molding method is used wherein a package 3 has, as side faces thereof, surfaces cut by dicing, and one flash memory chip 5 and two synchronous dynamic random access memory chips 6 are sealed inside. Since it has a structure wherein the synchronous dynamic random access memory chip 6 is mounted on the flash memory chip 5, the system memory module 1 can be brought into less size.

(2) Owing to the adoption of the block molding method, the manufacturing cost of the system memory module 1 can be reduced.

(3) When the flash memory chip 5 and the SDRAM chip 6 are divided into two in a chip longitudinal direction, address electrodes increases as compared with data electrodes in an area, e.g., A area on the side of the short side of one of them, whereas in an area, e.g., B area on the side of the short side of the other thereof, data electrodes become greater in number than address electrodes. Providing the areas in parts and disposing pins therein makes it possible to facilitate the routing of electrodes 7p of a wiring board 2 and reduce wiring lengths.

(4) Since a clock terminal is disposed such that each of clock electrodes of two dynamic random access memory chips to the clock terminal at each bump electrode on the back surface are connected to each other at the shortest distance therebetween, a high-speed operation of the system memory module 1 can be achieved.

(5) The system memory module 1 has power supplies kept in isolation. As a result, noise resistance properties can be improved since a wiring distance becomes long. When semiconductor chips different in operating voltage are used, testing can be done in units of the semiconductor chips upon tests such as burn-in or the like, and hence the tests can be facilitated.

(6) Since address/data pins for the SDRAM chip 6 and the flash memory chip 5 are disposed close to one another, the routing of wirings for a printed circuit board or mounting substrate with the system memory module 1 packaged thereon is made easy.

(7) Since the system memory module 1 has an address-bus separate configuration, it is connectable to all of CPUs and hence general versatility is improved.

(8) Since the system memory module 1 takes a data (I/O) bus separate configuration, it can be connected to a plurality of CPUs different in intended purpose, and an SDRAM and a flash memory can be separately operated in parallel.

(9) Since an electronic device such as a personal digital assistant or the like in which the system memory module 1 capable of performing a high-speed operation and a reduction in size is built, is capable of high-speed operation and can be brought into less size.

Figure 37A:
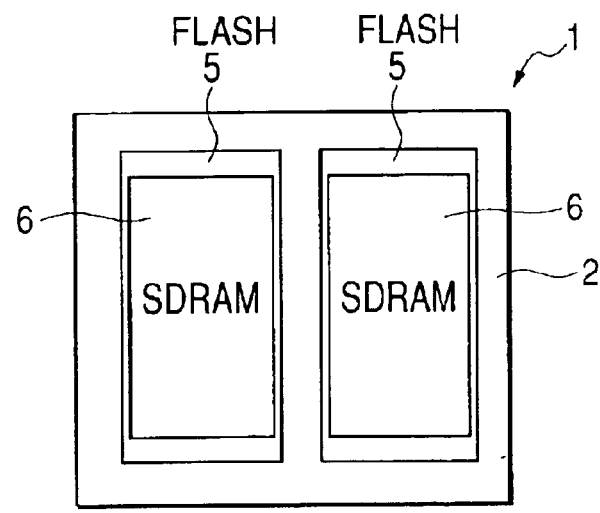
FIGS. 37a, 37b, 37c are block diagrams of a system memory module showing another embodiment of the present invention.
Figure 37B:
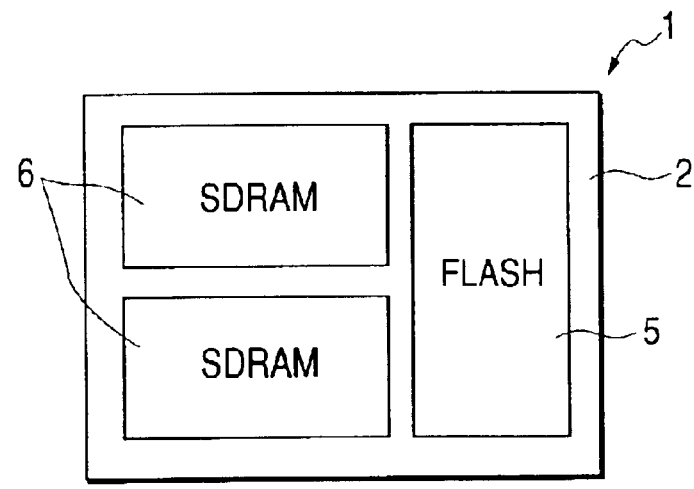
Figure 37C:
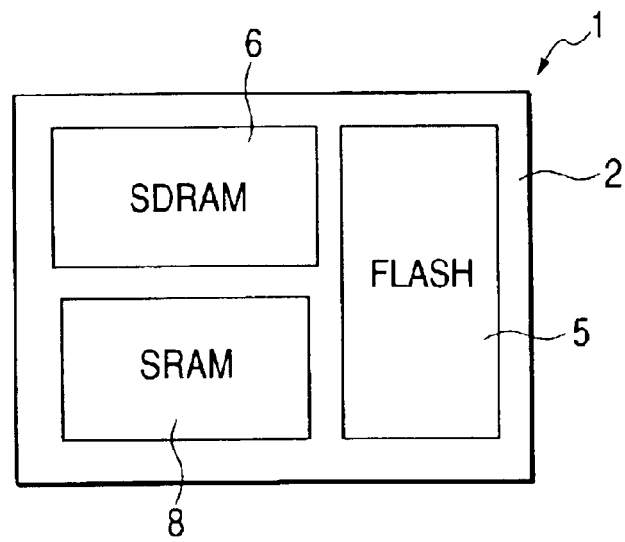

While the invention made above by the present inventors has been described specifically based on the illustrated embodiments, the present invention is not limited to the embodiments. It is needless to say that various changes can be made thereto within the scope not departing from the substance thereof. Namely, the combination of the semiconductor chips is not limited to the above-described embodiments. Other structures may be taken such as a structure wherein two flash memory chips 5 are fixed to a main surface of a wiring board 2 in parallel and SDRAM chips 6 are respectively mounted on these flash memory chips 5 as shown in FIG. 37(a), for example, a structure wherein one flash memory chip 5 and two SDRAM chips 6 are respectively fixed to a main surface of a wiring board 2 as shown in FIG. 37(b), a structure wherein a flash memory chip 5, a SDRAM chip 6 and a SRAM chip 8 with a SRAM built therein are respectively fixed one to a main surface of a wiring board 2, etc.

The present invention is applicable to the manufacture of a semiconductor device such as a system memory module or the like, having a configuration wherein semiconductor chips having various configurations are mounted on at least a main surface of a wiring board and electrodes of the respective semiconductor chips and electrodes of the wiring board are connected by wires, and an encapsulater formed by block-molding the main surface of the wiring board is provided and external electrode terminals are provided on the back surface of the wiring board.

Advantageous effects obtained by typical ones of the inventions disclosed in the present application will be described in brief as follows:

(1) A small-sized and inexpensive semiconductor device can be provided wherein dynamic memories (synchronous dynamic random access memory and a flash memory) are incorporated into a single encapsulater or mold.

(2) An electronic device capable of performing high-speed operation and being reduced in size can be provided wherein a system memory module is built therein.

(3) Owing to the separate provision of address and data buses of an SDRAM and a flash memory, a test can be facilitated and general versatility can be improved.

(4) Since power supplies are separated between a SDRAM and a flash memory chip, the generation of noise can be suppressed.

(5) A personal digital assistant capable of performing a high-speed operation and being reduced in size can be provided wherein a system memory module is built.

What is claimed is:
1. A semiconductor device comprising:
a wiring board having a main surface, an insulating film formed on the main surface, and a plurality of electrodes formed on the main surf ace, said wiring board having external electrode terminals formed on a back surface used as a reverse side of the main surface;
semiconductor chips each having a main surface and a back surface and having one or more semiconductor elements and a plurality of electrodes formed on the main surface, said back surface being fixed to the main surface of said wiring board face to face therewith with an adhesive interposed therebetween;
conductive wires which connect electrodes on the main surface of said wiring board to electrodes of said each semiconductor chip; and
an encapsulater which covers said semiconductor chips, the main surface of said wiring board and the electrodes,
wherein at least one dynamic random access memory chip with a dynamic random access memory built therein and at least one flash memory chip with a flash memory built therein are fixed to said wiring board as said semiconductor chips,
wherein the electrodes of said flash memory chip are respectively disposed side by side in a row along edges of both short sides thereof,
wherein the electrodes of said dynamic random access memory chip are disposed side by side along a long side thereof,
wherein the address electrodes are larger in number than the data electrodes in an electrode row of one short side of said flash memory chip, and the data electrodes are larger in number than the address electrodes in an electrode row of the other short side of said flash memory chip,
wherein the address electrodes are larger in number than the data electrodes in a half electrode row close to one short side of said flash memory chip with respect to distributions of the address electrodes and data electrodes in the electrode rows of said dynamic random access memory chip, and
wherein the data electrodes are larger in number than the address electrodes in a half electrode row close to the other short side of said flash memory chip.

* * * * *